US012565421B2

(12) United States Patent
Daruwalla et al.

(10) Patent No.: US 12,565,421 B2
(45) Date of Patent: Mar. 3, 2026

(54) MICROELECTROMECHANICAL DEVICES FOR HIGHER ORDER PASSIVE TEMPERATURE COMPENSATION AND METHODS OF DESIGNING THEREOF

(71) Applicant: Stathera IP Holdings Inc., Montreal (CA)

(72) Inventors: Anosh Daruwalla, Montreal (CA); Reuble Mathew, Montreal (CA)

(73) Assignee: Stathera IP Holdings, Inc., Montreal (CA)

( * ) Notice: Subject to any disclaimer, the term of this patent is extended or adjusted under 35 U.S.C. 154(b) by 508 days.

(21) Appl. No.: 17/973,896

(22) Filed: Oct. 26, 2022

(65) Prior Publication Data

US 2023/0131902 A1      Apr. 27, 2023

Related U.S. Application Data

(60) Provisional application No. 63/271,956, filed on Oct. 26, 2021.

(51) Int. Cl.
B81B 7/02 (2006.01)

(52) U.S. Cl.
CPC ........ B81B 7/02 (2013.01); *B81B 2201/0271* (2013.01); *B81B 2203/0307* (2013.01); *B81B 2203/0315* (2013.01); *B81B 2203/04* (2013.01)

(58) Field of Classification Search
CPC .. H03H 9/02448; H03H 9/125; H03H 9/2405; H03H 2009/155; H03H 3/0076;
(Continued)

(56) References Cited

U.S. PATENT DOCUMENTS 6,557,419 B1     5/2003   Herb et al.
7,839,239 B2    11/2010   Sworowski et al.
(Continued)

FOREIGN PATENT DOCUMENTS

EP     2 676 366 B1    12/2020
EP     3 000 176 B1     3/2021
(Continued)

OTHER PUBLICATIONS

International Searching Authority, International Search Report and Written Opinion, PCT International Application No. PCT/CA2022/051591, Jan. 10, 2023, 17 pages.
(Continued)

*Primary Examiner* — Moazzam Hossain
(74) *Attorney, Agent, or Firm* — Lee Sullivan Shea & Smith LLP

(57) ABSTRACT

An example silicon MEMS resonator device includes a support structure, a resonator element with at least one associated eigenmode of vibration, at least one anchor coupling the resonator element to the support structure, at least one driving electrode, and at least one sense electrode. The resonator element is homogeneously doped with N-type or P-type dopants to a doping concentration that causes a closely temperature-compensated mode in which (i) an absolute value of a first order temperature coefficient of frequency of the resonator element is reduced to a first value below a threshold value and (ii) an absolute value of a second order temperature coefficient of frequency of the resonator element is reduced to about zero. Further, a geometry of the resonator element is chosen such that the absolute value of the first order temperature coefficient of frequency is further reduced to a second value smaller than the first value.

23 Claims, 18 Drawing Sheets

(58) Field of Classification Search

CPC ............. H03H 9/02244; H03H 3/0072; H03H 9/1057; H03H 2003/027; H03H 2009/02251; H03H 3/013; H03H 9/0561; H03H 9/462; H03H 3/04; B81B 3/0081; B81B 3/0021; B81B 3/01

See application file for complete search history.

(56) References Cited

U.S. PATENT DOCUMENTS

| | | | |
|---|---|---|---|
| 8,558,643 | B2 | 10/2013 | Prunnila et al. |
| 8,638,178 | B1 | 1/2014 | Wang |
| 8,669,831 | B2 | 3/2014 | Quevy et al. |
| 9,071,226 | B2 | 6/2015 | Jaakkola et al. |
| 9,559,660 | B2 | 1/2017 | Pensala et al. |
| 9,590,587 | B1 | 3/2017 | Thalmayr et al. |
| 9,602,026 | B2 | 3/2017 | Quevy et al. |
| 9,695,036 | B1 | 7/2017 | Berger et al. |
| 9,742,373 | B2 | 8/2017 | Raieszadeh et al. |
| 9,837,981 | B2 | 12/2017 | Jaakkola et al. |
| 10,476,477 | B1 | 11/2019 | Grosjean et al. |
| 10,541,666 | B1 | 1/2020 | Hagelin et al. |
| 10,676,349 | B1 | 6/2020 | Grosjean et al. |
| 11,082,024 | B1 | 8/2021 | Hagelin et al. |
| 11,533,042 | B2 | 12/2022 | Daruwalla et al. |
| 2002/0069701 | A1 | 6/2002 | Hsu et al. |
| 2008/0150655 | A1 | 6/2008 | Hagelin et al. |
| 2009/0160581 | A1 | 6/2009 | Hagelin et al. |
| 2010/0093125 | A1 | 4/2010 | Quevy et al. |
| 2010/0127596 | A1 | 5/2010 | Ayazi et al. |
| 2010/0283353 | A1 | 11/2010 | Van Der Avoort |
| 2011/0210801 | A1 | 9/2011 | Rottenberg et al. |
| 2012/0187507 | A1* | 7/2012 | Bontemps ............ H03H 9/2457 |
| | | | 716/112 |
| 2012/0230159 | A1 | 9/2012 | Hessler et al. |
| 2012/0305542 | A1 | 12/2012 | Donnay et al. |
| 2013/0293319 | A1 | 11/2013 | Winkler et al. |
| 2016/0006414 | A1 | 1/2016 | Chodavarapu et al. |
| 2016/0064642 | A1 | 3/2016 | Nishimura et al. |
| 2016/0099704 | A1* | 4/2016 | Jaakkola .................. H03H 9/17 |
| | | | 310/321 |
| 2017/0093361 | A1 | 3/2017 | Grosjean et al. |
| 2018/0019724 | A1* | 1/2018 | Doll ....................... H10N 30/06 |
| 2019/0112181 | A1 | 4/2019 | Jaakkola et al. |
| 2019/0222196 | A1 | 7/2019 | Daruwalla et al. |
| 2020/0028485 | A1 | 1/2020 | Doll et al. |
| 2021/0159875 | A1 | 5/2021 | Doll et al. |
| 2021/0226610 | A1 | 7/2021 | Komatsu et al. |

FOREIGN PATENT DOCUMENTS

| | | |
|---|---|---|
| EP | 3 829 060 A1 | 6/2021 |
| WO | 2014/188317 A1 | 11/2014 |
| WO | 2016/051025 A1 | 4/2016 |
| WO | 2023070214 A1 | 5/2023 |

OTHER PUBLICATIONS

Ayazi et al., "Compensation, Tuning, and Trimming of MEMS Resonators", IEEE International Frequency Control Symposium Proceedings, May 21-24, 2012, 7 pages.

Bourgeois et al., "Design of Resonators for the Determination of the Temperature Coefficients of Elastic Constants of Monocrystalline Silicon", Proceedings of International Frequency Control Symposium, 1997, 791-799.

Chen et al., "In-Situ Ovenization of Lame-Mode Silicon Resonators for Temperature Compensation", 28th IEEE International Conference on Micro Electro Mechanical Systems (MEMS), Jan. 18-22, 2015, 809-812.

Chen et al., "Ovenized Dual-Mode Clock (ODMC) Based on Highly Doped Single Crystal Silicon Resonators", IEEE 29th International Conference on Micro Electro Mechanical Systems (MEMS), Jan. 24-28, 2016, 91-94.

Daruwalla et al., "Low Motional Impedance Distributed Lame Mode Resonators for High Frequency Timing Applications", Microsystems & Nanoengineering, vol. 6, No. 53, 2020, 11 pages.

Hall, John J. "Electronic Effects in the Elastic Constants of n-Tyye Silicon", Physical Review, Sep. 15, 1967, vol. 161, No. 3, 756-761.

Hsu et al., "Stiffness-Compensated Temperature-Insensitive Micromechanical Resonators", Technical Digest. MEMS 2002 IEEE International Conference, Fifteenth IEEE International Conference on Micro Electro Mechanical Systems (Cat. No. 02CH37266), Jan. 24, 2002, 731-734.

Jaakkola et al., "Determination of Doping and Temperature-Dependent Elastic Constants of Degenerately Doped Silicon from MEMS Resonators", IIEEE Transactions on Ultrasonics, Ferroelectrics, and Frequency Control, Jul. 2014, vol. 61, No. 7, 1063-1074.

Jakkola et al., "Temperature Compensated Resonance Modes of Degenerately n-doped Silicon MEMS Resonators", IEEE International Frequency Control Symposium Proceedings, May 21-24, 2012, 5 pages.

Khan et al., "Temperature Dependence of the Elastic Constants of P+ Silicon", Physica Status Solidi (b):, 1985, vol. 128, No. 1, 31-38.

Melamud et al., "Temperature-Compensated High-Stability Silicon Resonators", Applied Physics Letters, 2007, vol. 90, No. 244107, 4 pages.

Melamud et al., "Temperature-Insensitive Composite Micromechanical Resonators" Journal of Microelectromechanical Systems, vol. 18, No. 6, Dec. 2009, 1409-1419.

Ng et al., "Temperature Dependence of the Elastic Constants of Doped Silicon", Journal of Microelectromechanical Systems, vol. 24, No. 3, 2015, 730-741.

Ng, Eldwin J. "Temperature-Compensated Silicon Mems Resonators with High Quality Factors and Low Motional Impedances", PhD Thesis, Aug. 2015, 261 pages.

Perrott et al., "A Temperature-to-Digital Converter for a MEMS-Based Programmable Oscillator With 0.5-ppm Frequency Stability and 1-ps Integrated Jitter", IEEE Journal of Solid-State Circuits, vol. 48, No. 1, Jan. 2013, 276-291.

Randles et al., "Temperature Compensated AIN Based SAW", Journal of Automation and Control Engineering, vol. 2, No. 2, Jun. 2014, 191-194.

Samarao et al., "Quality Factor Sensitivity To Crystallographic Axis Misalignment In Silicon Micromechanical Resonators", Solid-State Sensors, Actuators, and Microsystems Workshop Hilton Head Island, South Carolina, Jun. 6-10, 2010, 479-482.

Samarao et al.,"Temperature Compensation of Silicon Micromechanical Resonators via Degenerate Doping", IEEE International Electron Devices Meeting (IEDM), Dec. 7-9, 2009, 4 pages.

Sankaragomathi et al. "A ±3ppm 1.1mW FBAR Frequency Reference with 750MHz Output and 750mV Supply", IEEE International Solid-State Circuits Conference, Feb. 22-26, 2015, 3 pages.

Shahraini et al., "Temperature Coefficient of Frequency in Silicon-Based Cross-Sectional Quasi Lame; Mode Resonators," IEEE International Frequency Control Symposium (IFCS), 2018, 5 pages.

Tabrizian et al., "Acoustically-Engineered Multi-Port AIN-on-Silicon Resonators for Accurate Temperature Sensing", IEEE International Electron Devices Meeting, Dec. 9-11, 2013, 18.1.1-18.1.4.

Tabrizian et al., "High-Q Energy Trapping of Temperature-Stable Shear Waves with Lame Cross-Sectional Polarization in a Single Crystal Silicon Waveguide", Applied Physics Letters, 2016, vol. 108, No. 113503, 6 pages.

Tabrizian et al., "Temperature-Stable Silicon Oxide (SilOx) Micromechanical Resonators", IEEE Transactions on Electron Devices, vol. 60, No. 8, Aug. 2013, 2656-2663.

Yang et al., "Nonlinearity of Degenerately Doped Bulk-Mode Silicon MEMS Resonators". Journal of Microelectromechanical Systems, vol. 25, No. 5, Oct. 2016, 859-869.

Yen et al., "High-frequency Reference System Implementations Utilizing Mirror-encapsulated BAW Resonators", Joint Conference of the IEEE International Frequency Control Symposium and International Symposium on Applications of Ferroelectrics (IFCS-ISAF), Jul. 19-23, 2020, 2 pages.

(56) References Cited

OTHER PUBLICATIONS

Yen et al., "Integrated High-frequency Reference Clock Systems Utilizing Mirror-encapsulated BAW Resonators", IEEE International Ultrasonics Symposium (IUS), Oct. 6-9, 2019, 2174-2177.

Zhu et al., "Crystallographic and Eigenmode Dependence of TCf for Single Crystal Silicon Contour Mode Resonators", IEEE 26th International Conference on Micro Electro Mechanical Systems (MEMS), Taipei, Taiwan, Jan. 20-24, 2013, 761-764.

International Searching Authority, International Search Report and Written Opinion mailed on Jul. 18, 2025, issued in connection with International Application No. PCT/US2021/050603, filed on Apr. 25, 2025, 11 pages.

* cited by examiner

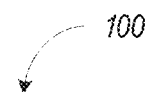

102 — Determine, for a resonator element of a MEMS resonator device, an initial geometry and an initial orientation with respect to the crystal axis of silicon, which causes the resonator element to have at least one associated eigenmode of vibration

104 — Select, from the associated eigenmodes, a particular eigenmode

106 — Determine, for the resonator element with the particular eigenmode, a plurality of sets of parameters, each set of the plurality of sets defining a respective combination of (I) a type of dopant, (II) a doping concentration

108 — Select, from among the plurality of sets of parameters, a particular set of parameters for analysis

110 — Calculate TCF2 for the particular set of parameters

112 — Is TCF2 ≅ 0?        No

Yes

114 — Calculate TCF1 for the particular set of parameters

116 — Does the particular set of parameters result in a CTC mode?        No

Yes

118 — Calculate, for the resonator element with the particular set of parameters, TCF1 for a selection of applied in-plane rotations

120 — Select, from among the selection of applied in-plane rotations, an in-plane rotation which minimizes the absolute value of TCF1

122 — Subtract one or more additional areas, add one or more additional areas or apply a combination of both to the resonator element

124 — Is TCF1 ≅ 0?        No

Yes

126 — At least second order temperature compensated MEMS resonator device

FIG. 1

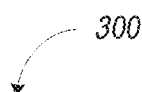

302

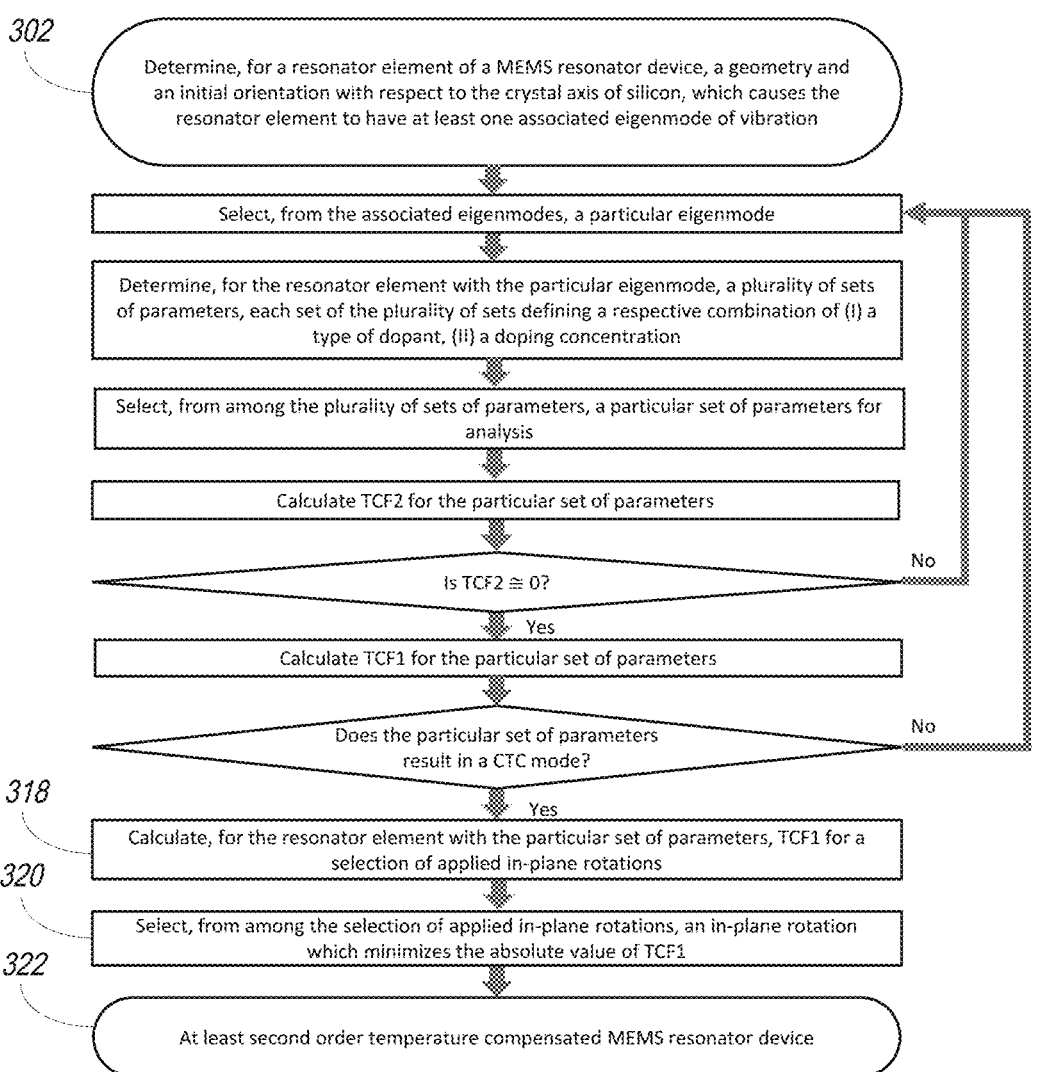

Determine, for a resonator element of a MEMS resonator device, a geometry and an initial orientation with respect to the crystal axis of silicon, which causes the resonator element to have at least one associated eigenmode of vibration Select, from the associated eigenmodes, a particular eigenmode Determine, for the resonator element with the particular eigenmode, a plurality of sets of parameters, each set of the plurality of sets defining a respective combination of (I) a type of dopant, (II) a doping concentration Select, from among the plurality of sets of parameters, a particular set of parameters for analysis Calculate TCF2 for the particular set of parameters Is TCF2 ≅ 0?    No Yes Calculate TCF1 for the particular set of parameters Does the particular set of parameters result in a CTC mode?    No Yes

318

320

Calculate, for the resonator element with the particular set of parameters, TCF1 for a selection of applied in-plane rotations Select, from among the selection of applied in-plane rotations, an in-plane rotation which minimizes the absolute value of TCF1

322

At least second order temperature compensated MEMS resonator device

FIG. 3

Lamé Mode

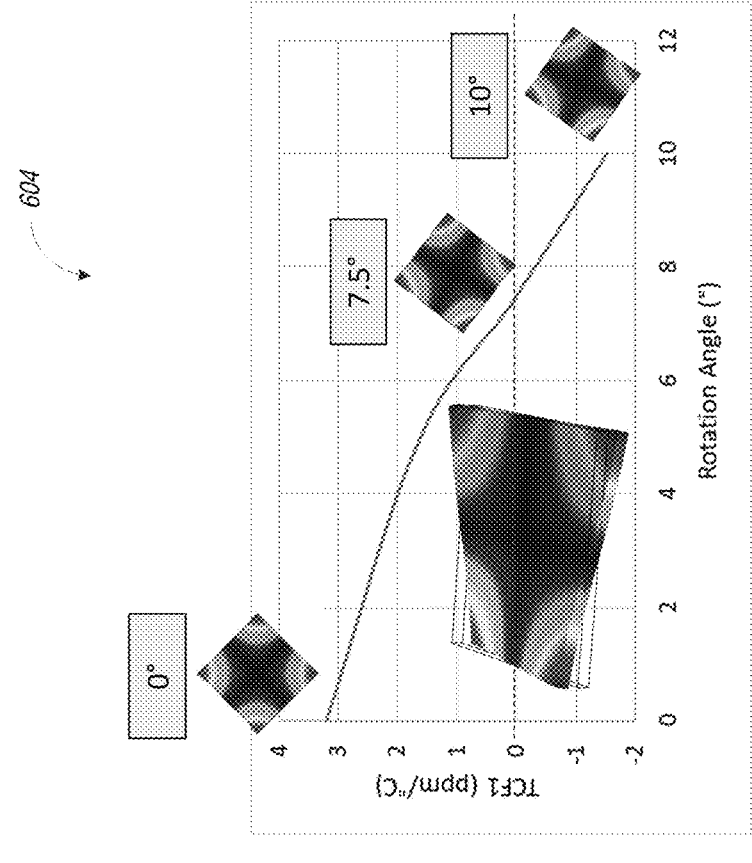
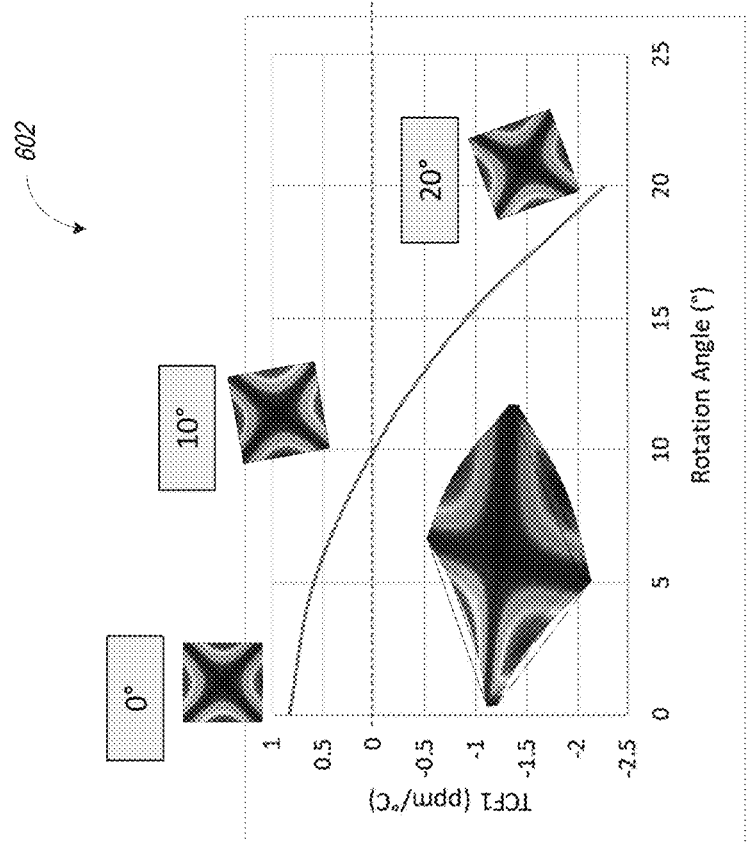
FIG. 6

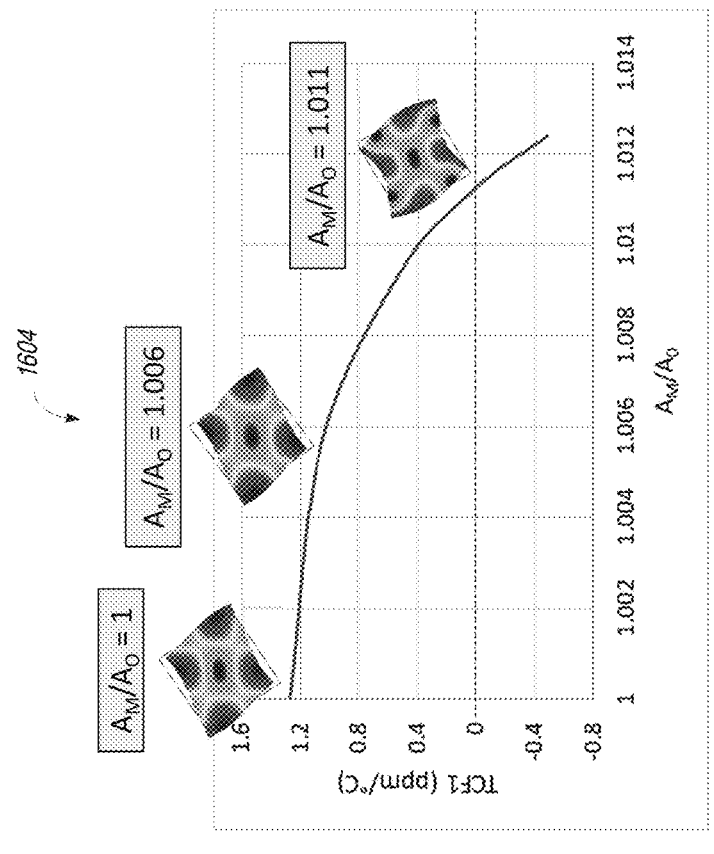
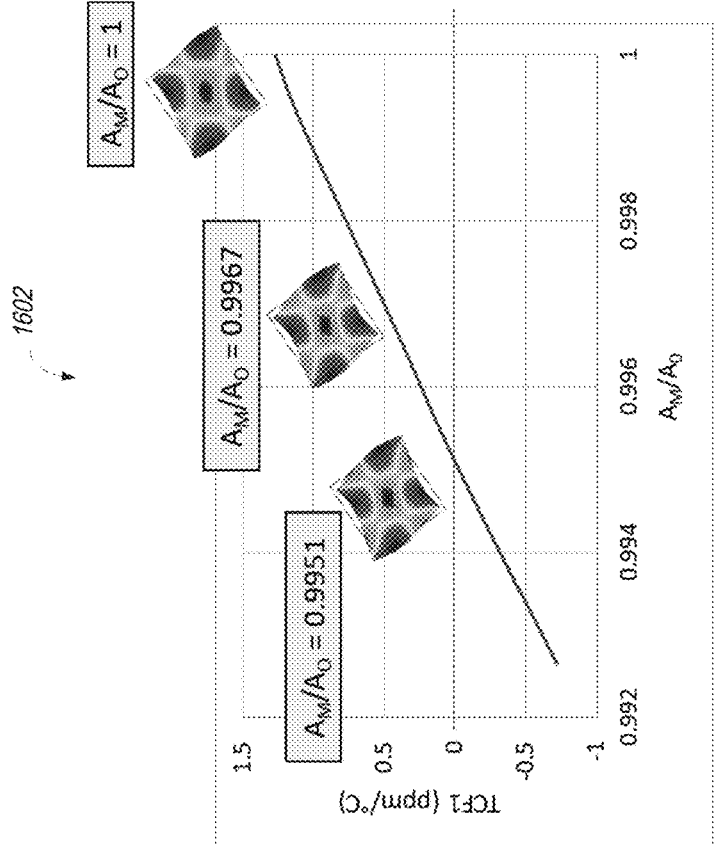
FIG. 16

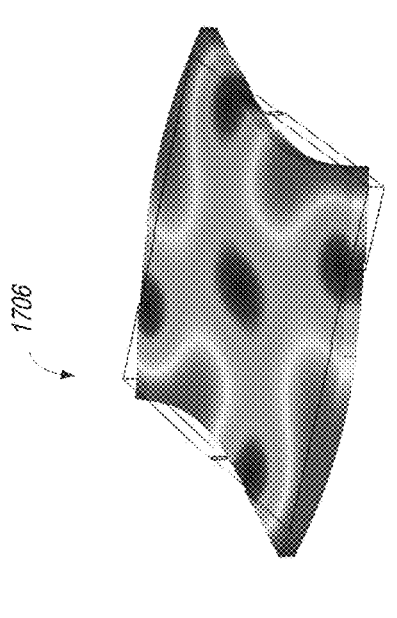
1706
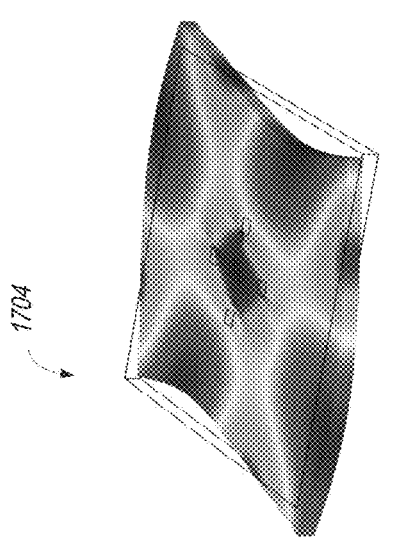
1704
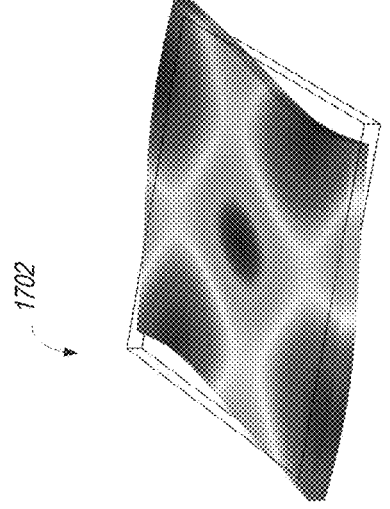
1702
FIG. 17

1

MICROELECTROMECHANICAL DEVICES FOR HIGHER ORDER PASSIVE TEMPERATURE COMPENSATION AND METHODS OF DESIGNING THEREOF

CROSS-REFERENCE TO RELATED APPLICATIONS

This application claims priority to U.S. Provisional Application No. 63/271,956, filed Oct. 26, 2021, which is incorporated herein by reference in its entirety.

BACKGROUND

The advent of Internet of Things (IoT) has given rise to a myriad of sensor-based devices used in wearables, smartphones, and remote sensing for industrial and consumer applications. Timing references are ubiquitous in these devices and help provide signals used to keep track of time, synchronize events in digital integrated circuits (ICs), and process signals. High-accuracy microelectromechanical systems (MEMS) resonators may be desirable for such high-performance electronic applications.

SUMMARY

It is an aim of the present disclosure to achieve an improved temperature compensated MEMS device, such as a resonator. In particular, an aim of the present disclosure is to achieve a resonator design which offers second-order temperature compensation. The disclosure also provides a method to design second-order temperature compensated micromechanical resonators for various purposes.

BRIEF DESCRIPTION OF THE DRAWINGS

Features, aspects, and advantages of the presently disclosed technology may be better understood with regard to the following description, appended claims, and accompanying drawings, as listed below. A person skilled in the relevant art will understand that the features shown in the drawings are for purposes of illustrations, and variations, including different and/or additional features and arrangements thereof, are possible.

FIG. 1 is a flowchart showing a general method for passively compensating both the first order and the second order temperature coefficients of frequency.

FIG. 3 is a flowchart showing a method for using in-plane rotation to yield at least partially temperature compensated MEMS resonator devices.

FIG. 6 depicts a plot of the first order temperature coefficient of frequency versus in-plane rotation angle with respect to the <110> crystal axis of silicon for a square resonator element operating in out of plane resonance modes.

Figure 7:
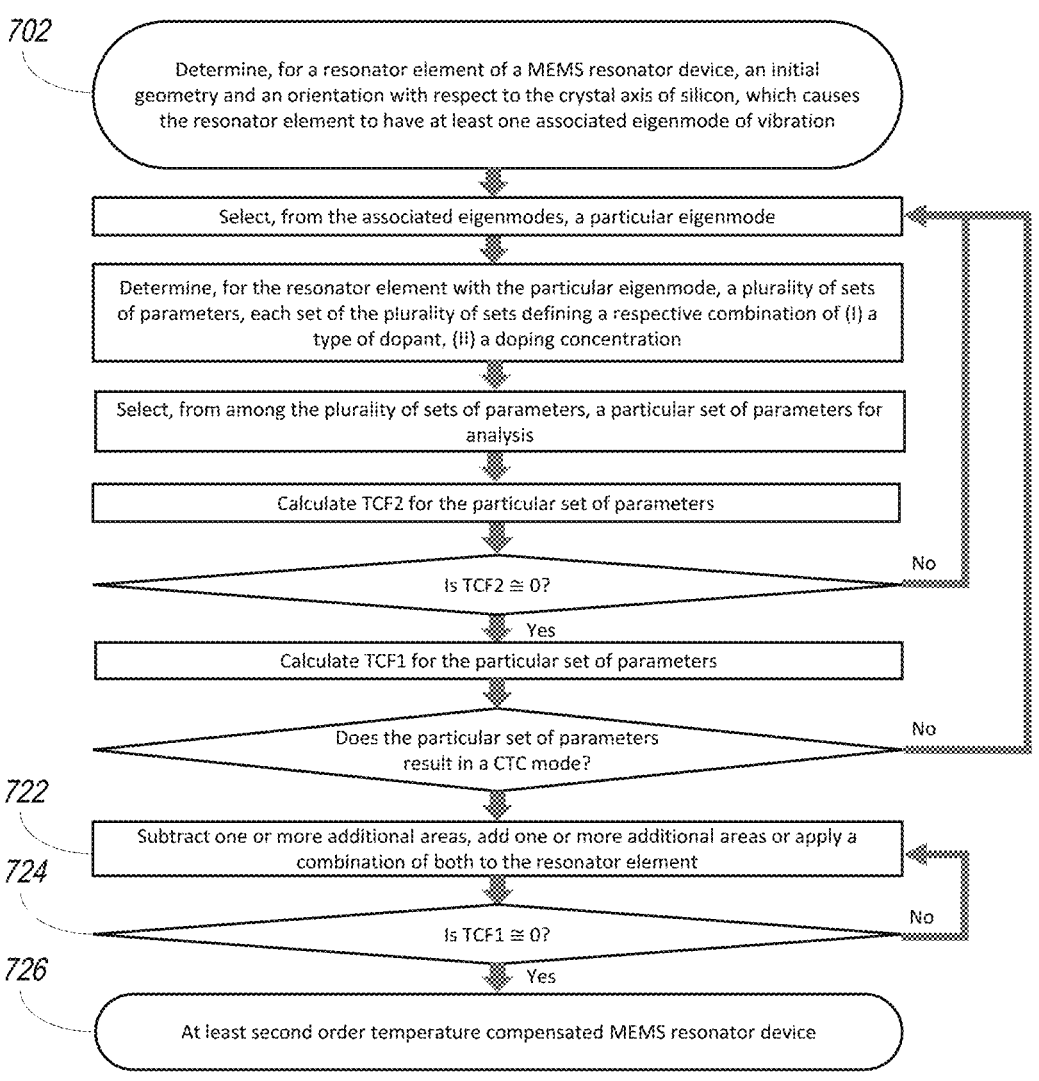

FIG. 7 is a flowchart showing a method for using geometric modifications to yield at least second order temperature compensated MEMS resonator devices.

Figure 8:
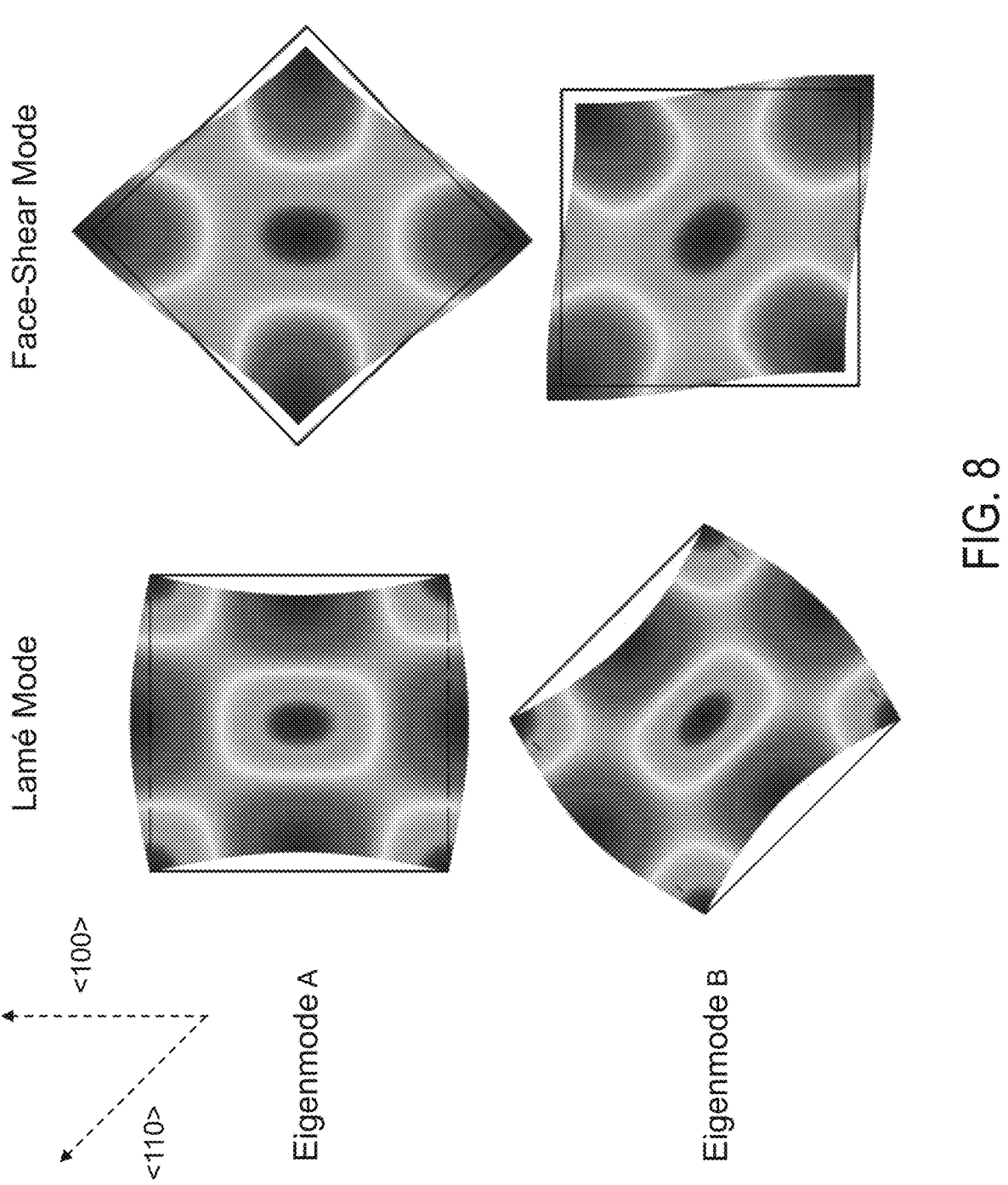

FIG. 8 depicts two in-plane eigenmodes for both a Lamé and a face-shear (FS) mode resonator.

Figure 9:
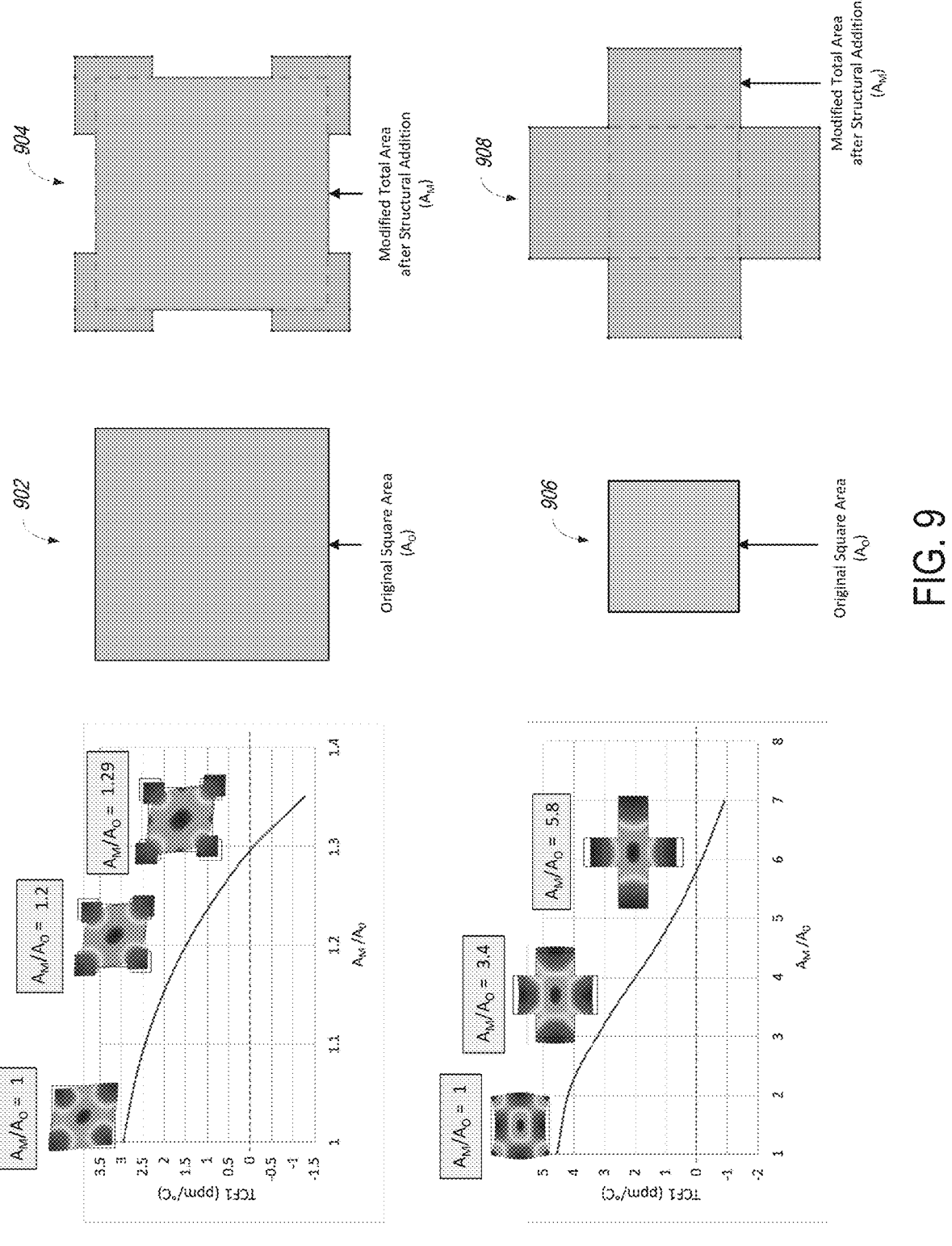

FIG. 9 depicts example geometric modifications that involve adding areas to a resonator element to compensate for a first order temperature coefficient of frequency.

Figure 10:
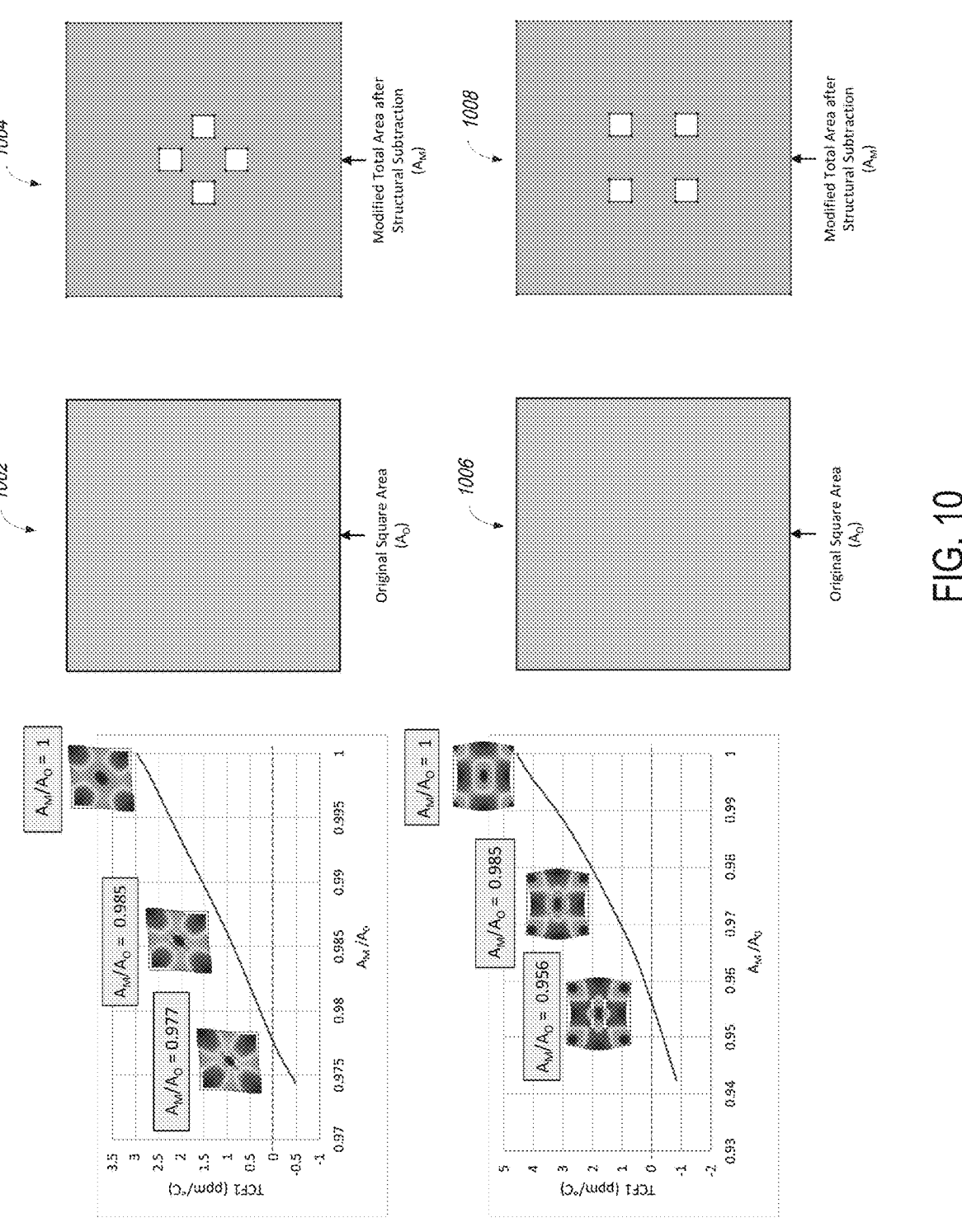

FIG. 10 depicts example geometric modifications that involve subtracting areas from a resonator element to compensate for a first order temperature coefficient of frequency.

Figure 11:
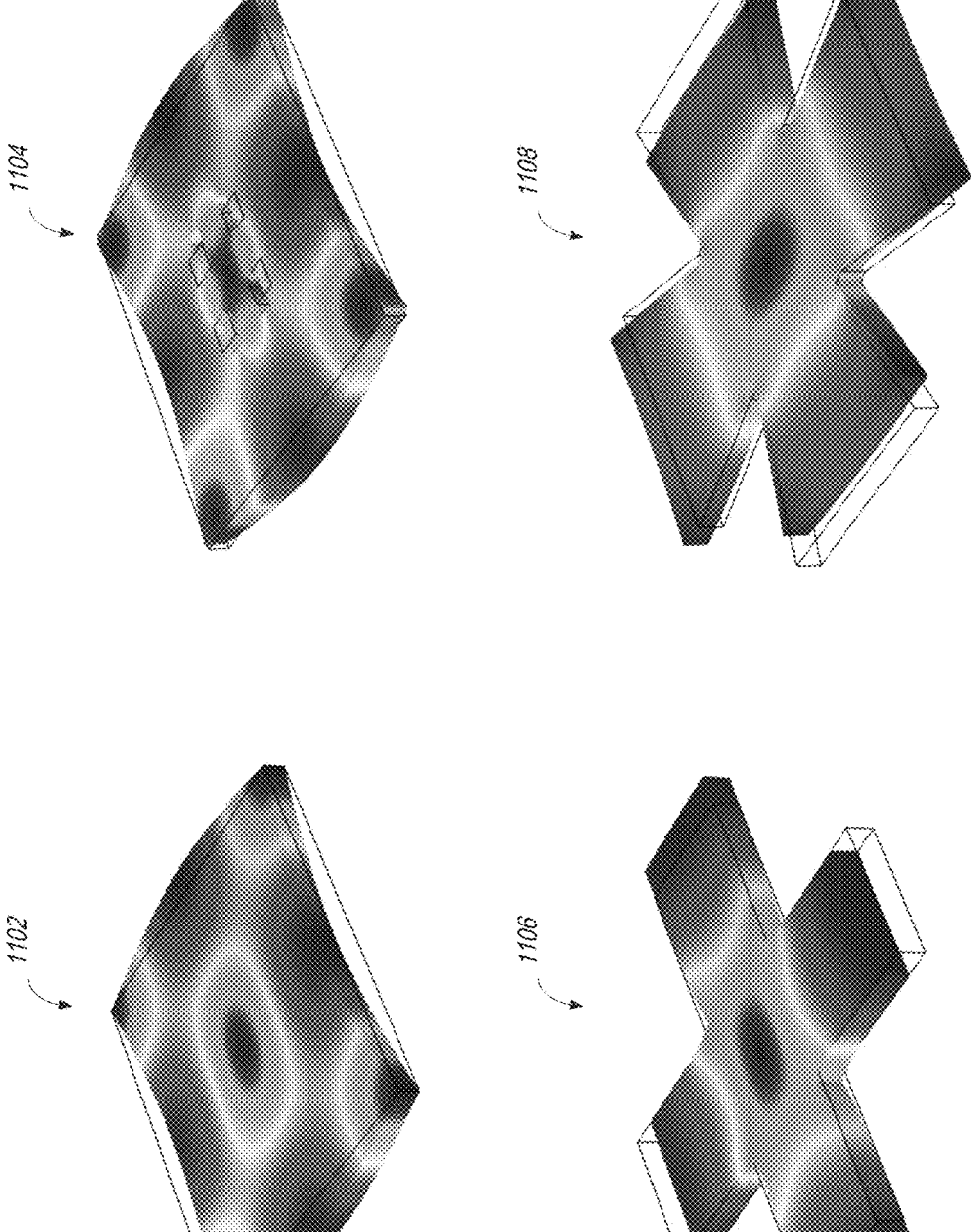

FIG. 11 depicts a Lamé resonance mode and examples of modified-Lamé resonance modes after geometric modification.

Figure 12:
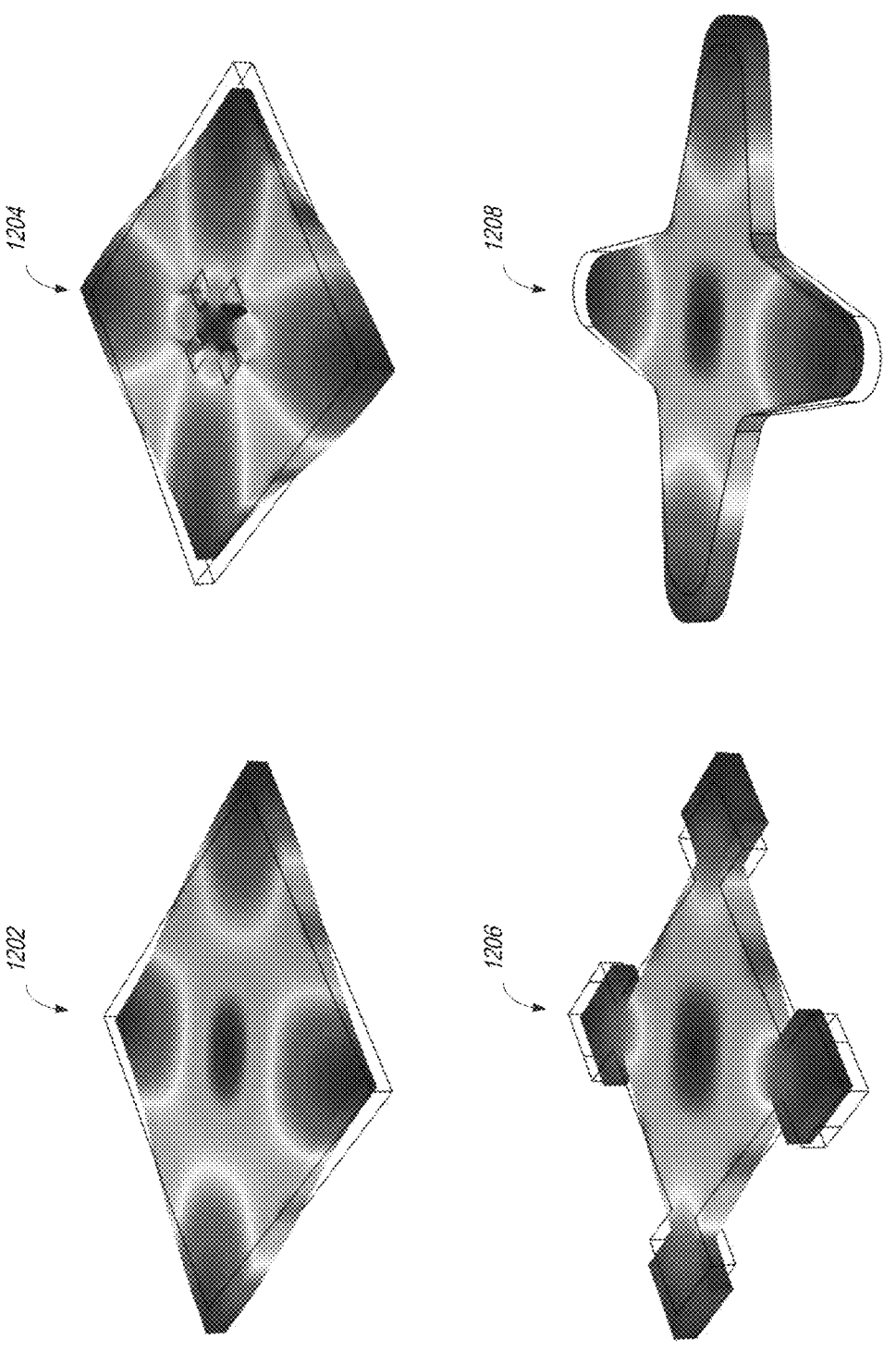

FIG. 12 depicts a FS resonance mode and examples of modified-FS resonance modes after geometric modification.

Figure 13:
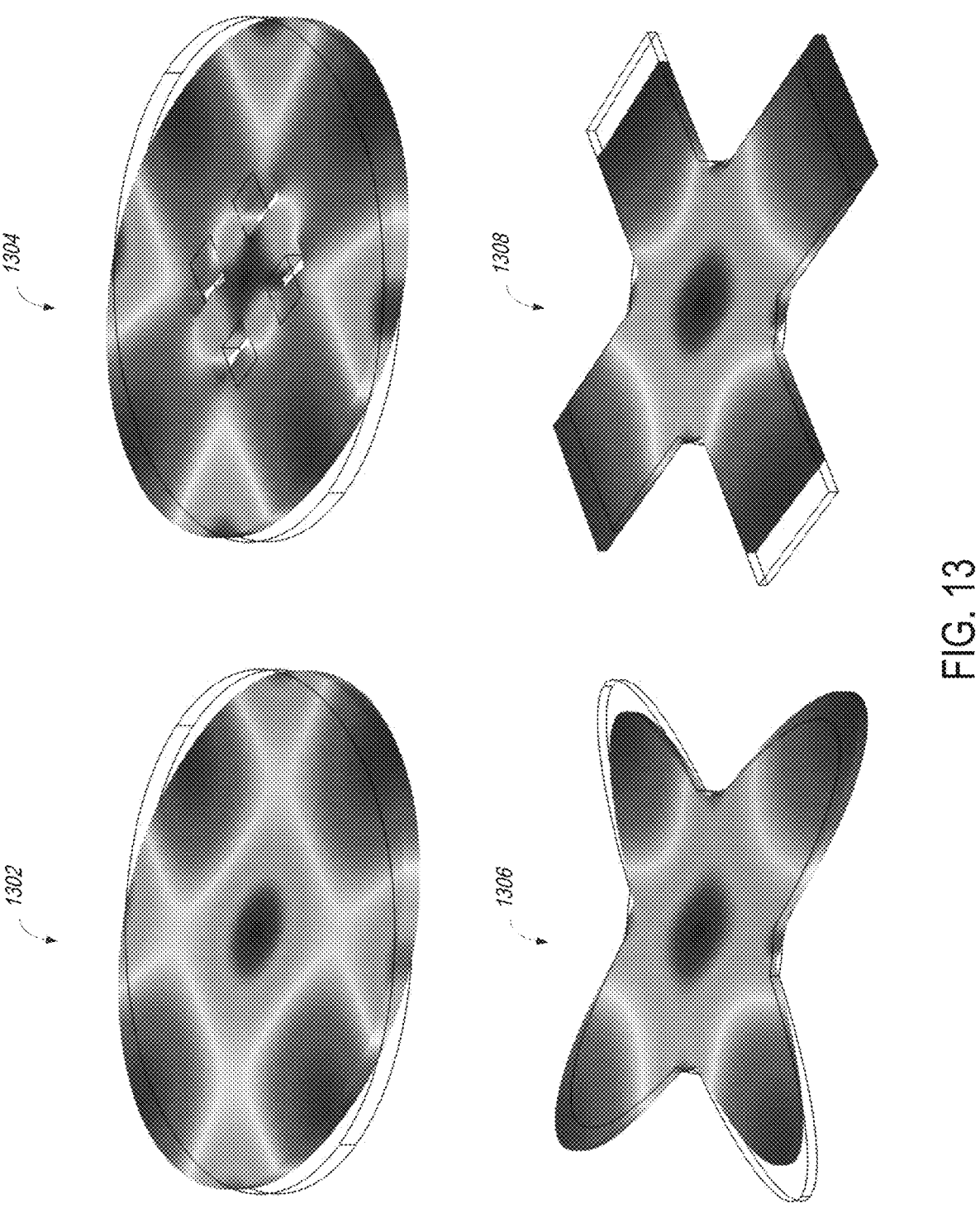

FIG. 13 depicts a wineglass resonance mode in a circular resonator element, and examples of modified-wineglass resonance modes after geometric modification.

Figure 14:
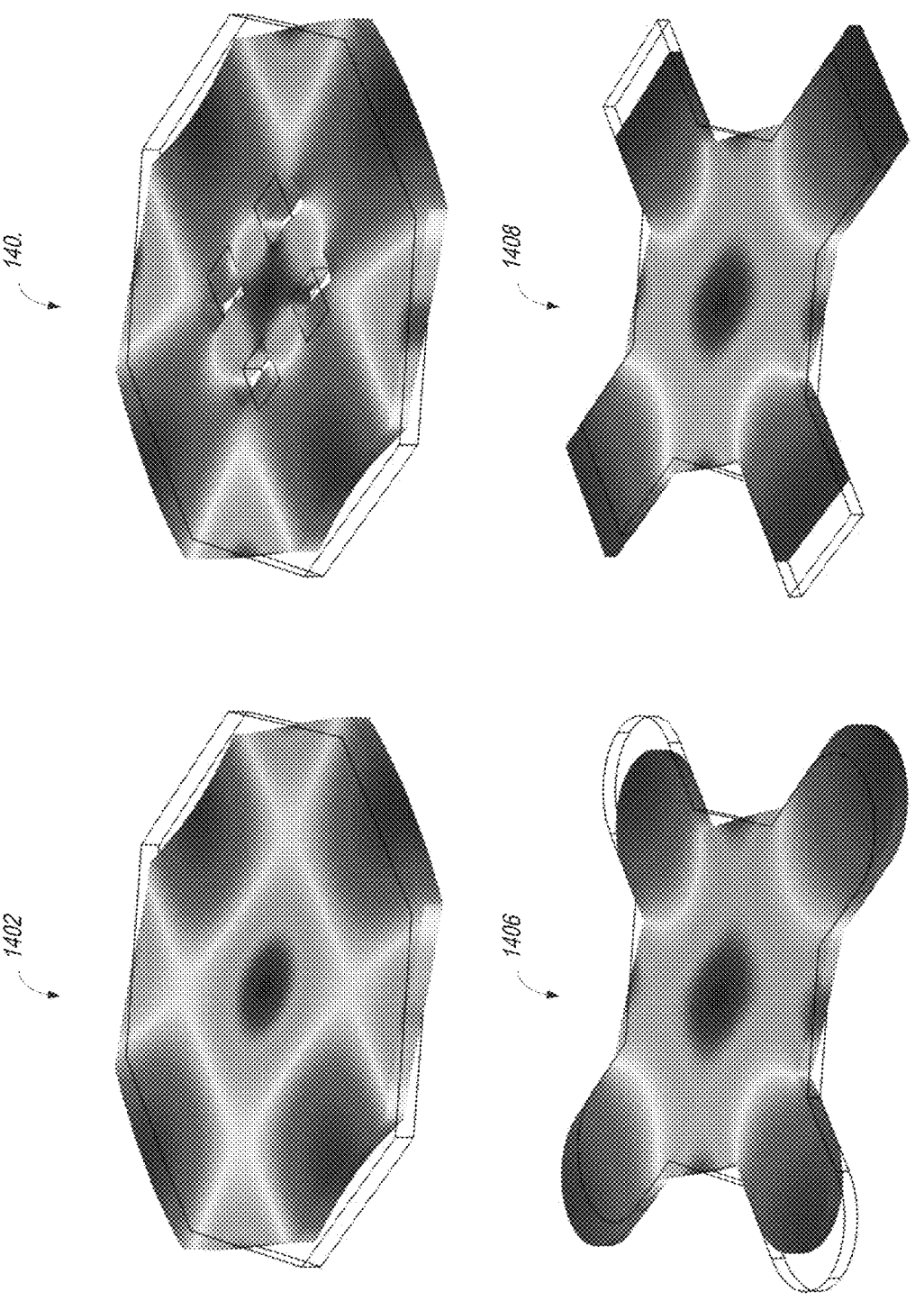

FIG. 14 depicts a wineglass resonance mode in an octagonal resonator element, and examples of modified-wineglass resonance modes after geometric modification.

Figure 15:
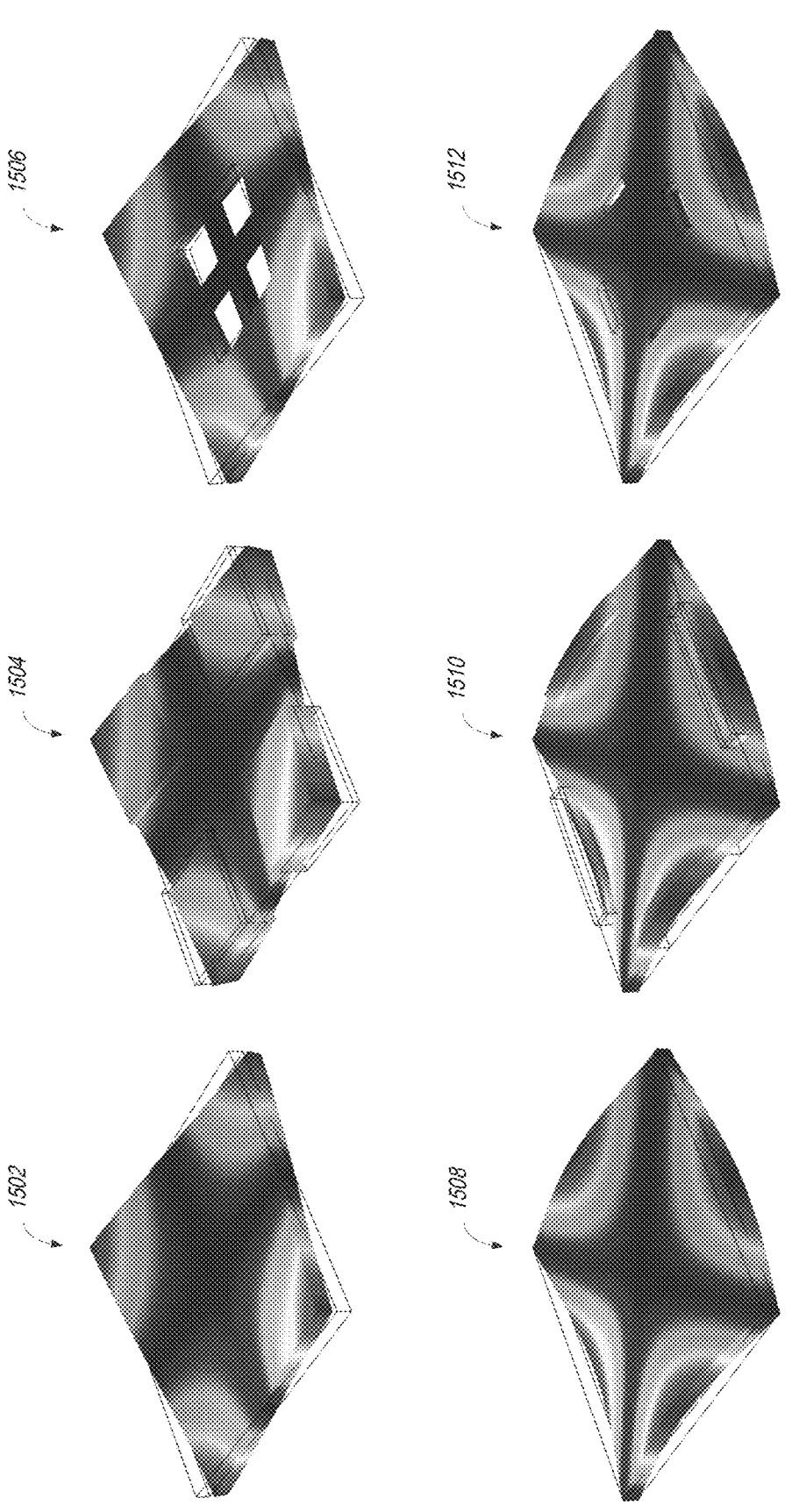

FIG. 15 depicts both a torsional and a saddle resonance mode and examples of modified-torsional and modified-saddle resonance modes after geometric modification.

FIG. 16 depicts example geometric modifications that involve subtracting areas from a Lamé mode resonator element rotated 34° with respect to the <110> crystal axis of silicon, to compensate for a first order temperature coefficient of frequency.

FIG. 17 depicts a Lamé mode resonator element rotated 34° with respect to the <110> crystal axis of silicon and an example of said resonator element after geometric modification.

The drawings are for the purpose of illustrating example embodiments, but those of ordinary skill in the art will understand that the technology disclosed herein is not limited to the arrangements shown in the drawings.

DETAILED DESCRIPTION

I. Overview

While quartz crystal oscillators have been the foundation of timing and frequency reference applications for the past century, the rapid development of sensor-based electronics has highlighted certain limitations of this technology, such as power consumption, robustness, size, and CMOS compatibility. Over the past two decades, MEMS resonators fabricated with silicon have drawn significant attention due to their small size, low cost, and integration compatibility. However, MEMS resonators still have not been able to replace their quartz counterparts in multiple applications.

A limitation of MEMS resonators that has curbed widespread adoption is the lack of temperature stability as compared to quartz. Silicon MEMS resonators have an inherent first order temperature-induced frequency drift of approximately −30 ppm/° C., resulting in a temperature stability of approximately 3,750 ppm over the industrial temperature range of −40° C. to 85° C. In comparison, AT-cut quartz resonators have a temperature stability of approximately 20 ppm over the industrial temperature range of operation. There have been several attempts made to overcome these temperature-induced frequency drifts, such as methods involving the use of highly doped silicon substrates and composite materials. However, these methods are insufficient as they provide only first order compensation of the temperature-induced frequency drift.

The change in frequency with respect to temperature of a MEMS resonator is given by the equation:

$$f(T) = f_o[TCF_1 \cdot (\Delta T) + TCF_2 \cdot (\Delta T)^2 + \dots]$$

where $f_0$ is the resonance frequency of the resonator at a reference temperature, $\Delta T$ is the deviation from the reference temperature, TCF1 is the first order temperature coefficient of frequency, and TCF2 is the second order temperature coefficient of frequency. For single crystal silicon the value of TCF2 is typically within the range of −25 to −80 ppb/°C.[2] depending on the dopant type and concentration, which can result in a temperature-induced frequency drift of approximately 200-400 ppm over the industrial temperature range. While this second order temperature-induced frequency drift is relatively small compared to the uncompensated temperature-induced frequency drift of silicon (~3,750 ppm based on −30 ppm/°C.), it is still significantly worse than the typical temperature-induced frequency drift that AT-cut quartz crystals can provide. As such, it is desirable to further reduce the temperature-induced frequency drift of fabricated silicon MEMS resonators in order enable their wide adoption in the timing market.

While it is possible to use active temperature compensation techniques to minimize temperature-induced frequency drifts, such techniques may place a significant burden on the system in terms of power consumption, circuit size, and circuit complexity. Hence it may be beneficial to find methods to passively compensate for temperature-induced frequency drifts in fabricated silicon MEMS resonators.

Various techniques have been used previously to passively compensate for temperature-induced frequency drifts. For example, fabricating composite MEMS resonators using a secondary material such as silicon dioxide ($SiO_2$) is a well-established technique. $SiO_2$ is known to have a large positive TCF1 (approximately 85 ppm/°C.), and due to its compatibility with silicon, it can be incorporated in silicon MEMS resonators to counterbalance the negative TCF1 of silicon. Within the industrial temperature range, total temperature-induced frequency drifts as low as sub-100 ppm have been achieved by this method. In the same temperature range, for smaller devices operating at higher frequencies (such as thin-film bulk acoustic resonators), temperature-induced frequency drifts as small as 3 ppm have been shown using this technique. However, one must take into consideration TCF2 effects of the oxide, which are not well documented in literature and difficult to measure due to its small scale, as well as the loss in resonator quality factor (Q) related to thermoelastic damping and/or surface losses. Moreover, this technique increases complexity in manufacturing and has reliability issues due to film-stresses, which lead to long-term aging issues.

Another example of an existing passive compensation technique involves fabricating MEMS resonators using highly-doped silicon substrates. This is a well-established technique as the TCF1 of particular resonance modes, including both shear and extensional modes, change with doping concentration (note, both Lamé and face shear modes are examples of shear modes). For example, within the industrial temperature range of −40° C. to 85° C., it is possible to limit the temperature-induced frequency drift of MEMS resonators operating in the Lamé mode to the range of 200-400 ppm using highly doped silicon substrates. However, even when TCF1 becomes zero, there still exists a significant amount of temperature-induced frequency drift caused by higher order temperature coefficients of frequency.

II. General Method for Passively Compensating for Temperature-Induced Frequency Drift in Silicon MEMS Resonators In the existing techniques discussed above, highly-doped silicon substrates can help engineer the TCF1 of a Lamé mode MEMS resonator to be almost zero. However, existing techniques are not effective enough at compensating higher order temperature-induced frequency drifts in silicon MEMS resonators, precluding competition with quartz crystal resonators. Thus, in the new techniques described herein, the high doping of the silicon substrate compensates for the TCF2 instead of the TCF1, and modifications to the resonator element compensate for the TCF1. Examples of such modifications to the resonator element can include either one or a combination of (i) adding areas to a resonator element, (ii) subtracting areas from a resonator element and (iii) changing the orientation of a resonator element with respect to the crystal axis of silicon. Using these techniques can provide at least second-order temperature compensation of the MEMS resonator device, leading to enhanced inherent temperature stability (such as a temperature-induced frequency drift of less than 1 ppm between −40° C. and 85° C.) with proper design. Such techniques are described in further detail below.

FIG. 1 depicts a flowchart 100 that illustrates a general method for designing a resonator element of a MEMS resonator device with passive compensation for temperature-induced frequency drift. The first phase of the method is to determine a type of dopant and a doping concentration at which TCF2 is equal to zero for a resonator element defined by an initial geometry, an initial orientation with respect to the crystal axis of silicon, and a set of associated eigenmodes. Herein, "eigenmode" refers to a natural vibration of a system such that various parts all move together at the same frequency. The set of eigenmodes can be determined using finite element methods (FEM) simulation software tools, or any other capable simulation software tools now known or later developed.

At block 102, the method involves determining or otherwise defining an initial resonator geometry and an initial orientation with respect to the crystal axis of silicon. This choice will subsequently define a selection of eigenmodes which are supported by the resonating element. While many eigenmodes may be supported by a given resonator element, they need not be exhaustively tested, and may be narrowed by the resonator design parameters such as desired Q-factor and operational frequency range. This occurs at block 104, where a particular eigenmode is chosen for analysis. Then, at block 106, a plurality of sets of parameters are determined or otherwise established, each set of the plurality of sets defining a respective combination of (i) a type of dopant and (ii) a doping concentration.

At blocks 108 and 110, the method involves selecting a single set of parameters for analysis and calculating TCF2 for the single set, respectively. The aim of this procedure is to identify a single set of parameters that causes TCF2 to be about equal to zero for the resonator element with the particular eigenmode. As shown in block 112, if TCF2 is about equal to zero, then the method proceeds to block 114. If not, then the method returns to block 104 in order to identify an alternative set of parameters that causes TCF2 to be about equal to zero.

At block 114, once a set of parameters has been identified that causes TCF2 to be about equal to zero for the resonator element and the particular eigenmode, the method involves calculating TCF1 for the type of dopant, the dopant concentration, and the resonator element with the particular eigenmode. At block 116, if the absolute value of TCF1 is large for the type of dopant, the dopant concentration, and the resonator element with the particular eigenmode, then the method returns to block 104 in order to identify an alternative type of dopant, dopant concentration and particular eigenmode that causes TCF2 to be about equal to zero. This process can be repeated until a type of dopant, dopant concentration, and resonator element with the particular eigenmode is identified that causes TCF2 to be about equal to zero while also reducing the magnitude of TCF1, which is referred to herein as a "closely temperature-compensated" (CTC) mode. If no combination of dopant concentration, type of dopant, and resonator element with the particular eigenmode results in a CTC mode, then the particular eigenmode is discarded and the method returns to block 104.

In some examples, a CTC mode corresponds to a mode in which the type of dopant, dopant concentration, and eigenmode of the resonator element causes TCF2 to be about equal to zero while also reducing the magnitude of TCF1 below a predefined threshold value. The predefined threshold value for TCF1 that results in a CTC mode may be a fixed value that is sufficiently lower than an uncompensated value for TCF1. For instance, because the uncompensated value of TCF1 in silicon has a magnitude of approximately 30 ppm/° C., the magnitude of the predetermined threshold value may be a lower value such as 10 ppm/° C., 5 ppm/° C., or even 1 ppm/° C. Alternatively, the threshold value for TCF1 that results in a CTC mode may not be a fixed value, but instead may be whichever calculated value for TCF1 at block 114 has the smallest magnitude. In this way, CTC modes correspond to modes that have a smaller magnitude TCF1 after compensating for TCF2 than non-CTC modes. By reducing the magnitude of TCF1 in this way, the amount of subsequent modification to compensate for TCF1 may likewise be reduced.

At block 118, once the CTC modes are identified, the next phase of the method is to apply modifications to the initial geometry and/or the initial orientation of the resonator element in order to slightly "distort" these CTC modes (introduce stray vibrations due to the modifications thereby causing a deviation from the pure mode shape). This kind of distortion changes the initial eigenmode by changing the contribution of the elastic constants of silicon ($C_{11}$, $C_{12}$, and $C_{44}$) to the initial eigenmode. By distorting the CTC modes by applying modifications to the initial geometry and/or the initial orientation of the resonator element, one can reduce the absolute value of TCF1, such that an at least partially temperature compensated MEMS resonator device can be designed. In some embodiments, it is possible to design a fully second order temperature compensated MEMS resonator device. The type of modifications that will result in at least partially temperature compensated MEMS resonator devices are determined using a parametric sweep approach performed with FEM.

In some examples, the method depicted in blocks 118 and 120 may be incorporated to apply in-plane rotation which alters the initial orientation of the resonator element with respect to the crystal axis of silicon. A sufficiently large set of different in-plane rotations should be tested such that the approximate angle of rotation that minimizes the absolute value of TCF1 is found.

In some examples, the method depicted in blocks 122 and 124 may be incorporated to apply geometric modifications which alter the initial geometry of the resonator element. These geometric modifications can include either one or a combination of (i) adding one or more areas to the resonator element and (ii) subtracting one or more areas from the resonator element. The geometric modifications are selected with a parametric sweep approach which entails establishing a selection of geometric shapes to be tested, systematically altering their dimensions and placement on the resonating element, and measuring the resultant TCF1. Thus, for a given resonator element, there may be multiple examples of geometric modifications that reduce TCF1.

In some examples, the method depicted in blocks 118 and 120 may be incorporated to apply an in-plane rotation to the resonator element before further modifying the geometry in blocks 122 and 124 with methods such as those described in the next section. Additionally, in some examples, the method depicted in blocks 118 and 120 may be bypassed based on resonator design requirements, while still giving the desired effect of reducing the absolute value of TCF1. Alternatively, in some examples, the method depicted in blocks 122 and 124 may be bypassed based on resonator design requirements, while still giving the desired effect of reducing the absolute value of TCF1. Finally, at block 126, the resulting design is that of a resonator having at least a second order temperature compensated mode.

It should be understood that, while the in-plane rotation and geometric modification techniques disclosed herein describe a general method for yielding second order temperature compensated MEMS resonators, the techniques can be similarly applied individually or in combination with one another. Additionally, it should be understood that the techniques disclosed herein also describe a general method for merely reducing the temperature-induced frequency drift of MEMS resonators without yielding fully second order temperature compensated MEMS resonators.

Figure 2:
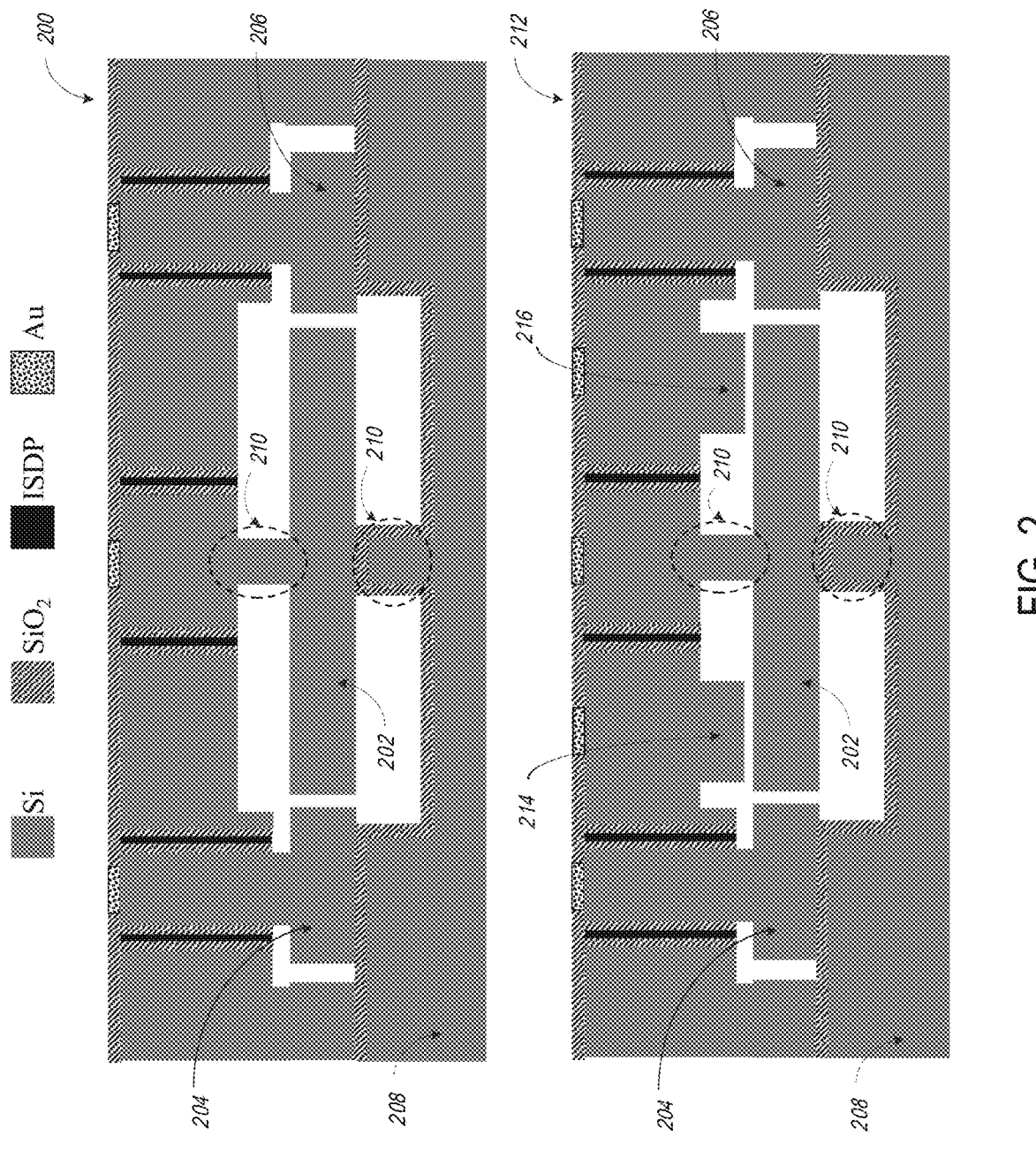
FIG. 2 depicts cross sections of passively compensated MEMS resonator devices.

FIG. 2 depicts example device configurations of second order temperature compensated MEMS resonators. A first device configuration 200 depicts a MEMS resonator device compatible with in-plane resonance modes. The MEMS resonator device includes a resonating element 202 that is at least partially temperature compensated, at least one drive electrode 204 for in-plane electrostatic actuation of the resonating element 202, and at least one sense electrode 206 for in-plane electrostatic sensing of the resonating element 202. The resonating element 202 is attached to a support structure 208 by one or more anchors 210. The anchors 210 may include side and/or post anchors. A second device configuration 212 depicts a MEMS resonator device compatible with out-of-plane resonance modes, with additional out-of-plane electrodes for out-of-plane actuating and sensing of the resonating element. The additional out-of-plane electrodes include at least one out-of-plane drive electrode 214 for out-of-plane actuation of the resonating element 202 and at least one out-of-plane sense electrode 216 for out-of-plane sensing of the resonating element 202.

III. Passively Compensating Temperature-Induced Frequency Drifts in Square MEMS Resonators Via In-Plane Rotation As previously stated, different cuts of quartz yield different temperature-induced frequency drifts, with the AT-cut quartz showing the least drift at approximately 20 ppm over the industrial temperature range. A similar approach can be used in silicon to reduce the temperature-induced frequency drift, but instead of applying different cuts to the silicon, alternative modifications can be applied in the form of in-plane rotation. Within the literature, first order temperature compensation has been achieved by applying particular combinations of doping concentration and in-plane rotation to silicon. However, existing techniques have been limited to controlling the first order temperature coefficient of frequency only, with uncompensated higher order TCFs causing significant temperature-induced frequency drifts. In contrast, in the example techniques described herein, the high doping of a silicon substrate compensates for TCF2 instead of TCF1, while in-plane rotations of a resonator element compensate for TCF1.

a. Method

FIG. 3 depicts a flowchart 300 that illustrates an example method for designing a passively compensated silicon MEMS resonator device with in-plane rotation to reduce temperature-induced frequency drift. The method depicted by flowchart 300 is largely similar to the method depicted by flowchart 100, except the method depicted by flowchart 300 does not involve applying any geometric modifications that alter the geometry of the resonator element and instead only involves applying an in-plane rotation to the resonator element to reduce TCF1. As shown, at block 302, the method depicted by flowchart 300 involves defining a resonator element geometry and an initial orientation of the resonator element with respect to the crystal axis of silicon. Here, because the method will eventually involve applying an in-plane rotation to the resonator element, as mentioned below, the resonator element geometry cannot be circular, as in-plane rotations will have no effect on the first order temperature coefficient of frequency for circular resonator elements. Once the geometry and initial orientation of the resonator element have been determined at block 302, the method continues similarly to the method depicted in flowchart 100 and proceeds until block 318 when a CTC mode has been identified.

Once a CTC mode has been identified, the next phase is to apply in-plane rotations to the resonator element at block 318 in order to slightly "distort" the CTC mode (introduce stray vibrations due to the geometric modifications thereby causing a deviation from the pure mode shape). A sufficiently large set of different in-plane rotations should be tested such that the approximate angle of rotation that minimizes the absolute value of TCF1 is found at block 320, where the method involves selecting, from among the different applied in-plane rotations, the in-plane rotation that results in the smallest absolute value of TCF1. Then, at block 322, after applying the in-plane rotation that results in the smallest absolute value of TCF1, the resulting design is that of a resonator element having at least partial temperature compensation.

b. Example with In-Plane Resonance Modes

Figure 4A:
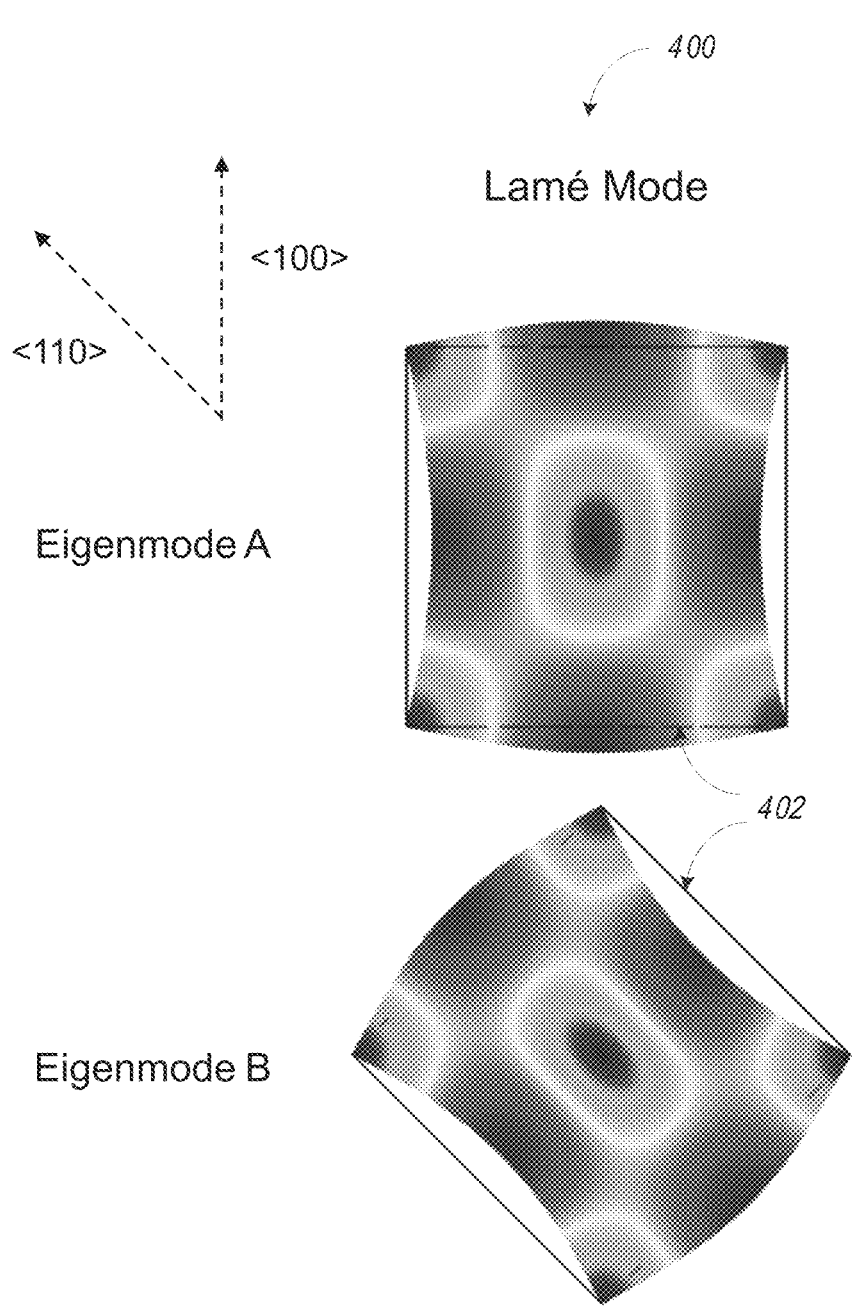
FIG. 4A depicts two in-plane eigenmodes for a Lamé mode resonator.

FIG. 4A depicts examples of a square silicon resonator element 400 that may be considered in connection with the method shown in FIG. 3. Resonator elements such as this may resonate in many in-plane resonance modes, but in this example only the Lamé mode is considered. Additionally, the only initial orientations with respect to the crystal axis of silicon that are considered are those with the resonator element edge 402 aligned to the <100> or <110> direction. Pure shear versions of the Lamé resonance mode are only present for square resonator elements with edges aligned to <100> and <110> directions to the silicon crystal lattice. For the Lamé resonance mode, the associated directions of modal expansion are the same as the alignment of the resonator edge. Therefore, for a Lamé resonance mode structure aligned in the <100> or <110> directions, the direction of modal expansion is in the <100> (Lamé Eigenmode A) or <110> (Lamé Eigenmode B) directions, respectively. Thus, only two eigenmodes are considered.

Figure 4B:
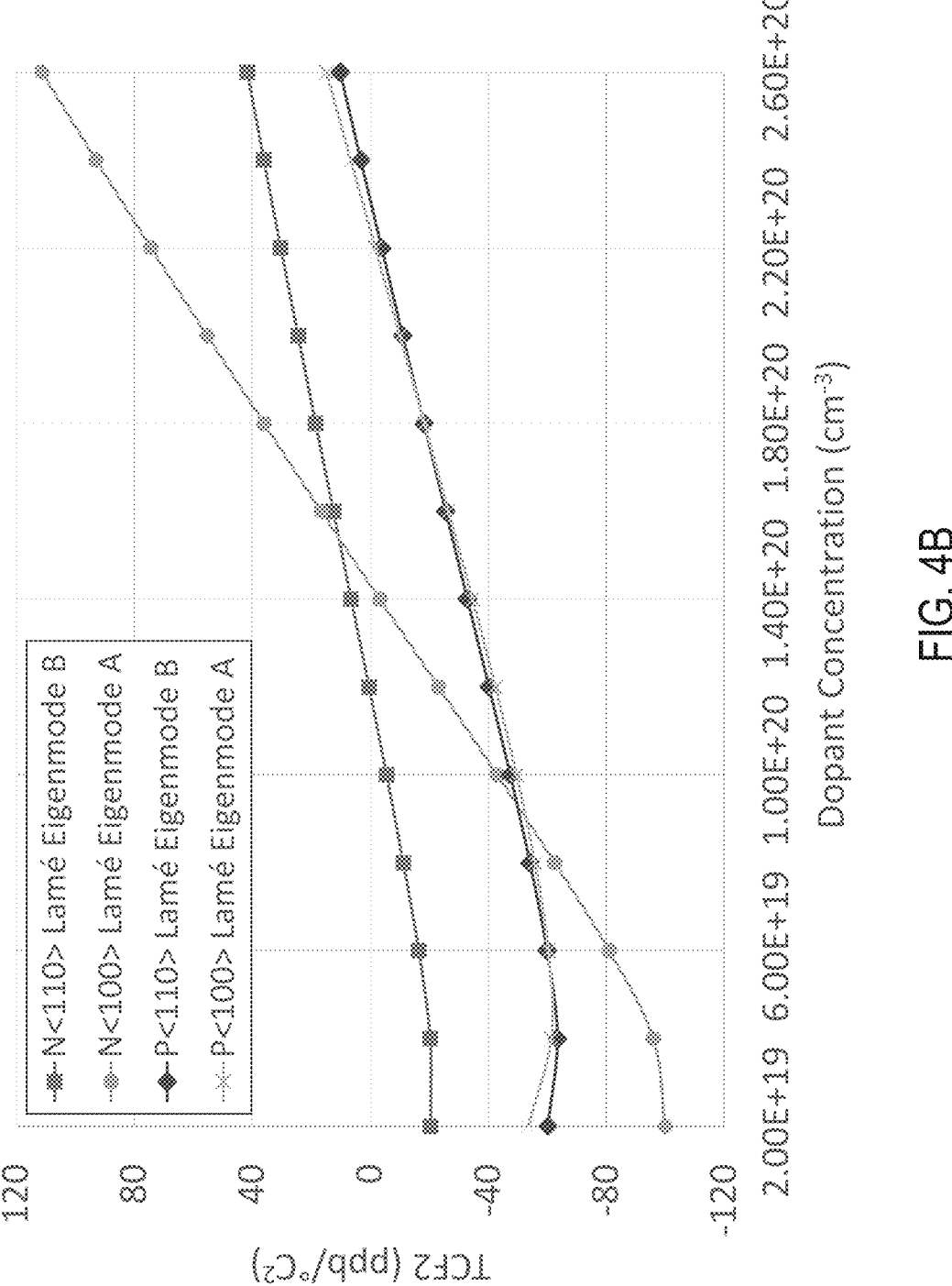
FIG. 4B depicts a plot of the second order temperature coefficient of frequency versus dopant concentration for a Lamé mode resonator oriented in either the <100> or <110> direction with respect to the crystal axis of silicon, with either N-type or P-type dopants.

FIG. 4B depict plots of values for TCF2 versus dopant concentrations for both N-type and P-type dopants for the different eigenmodes shown in FIG. 4A. From this, one can determine if there exists a combination of dopant concentration and type of dopant that causes TCF2 to be about equal to zero for a particular eigenmode. In silicon, the temperature coefficient of elasticity (TCE), and hence the TCF, of a given eigenmode depends on the temperature and doping dependence of the three independent elastic constants ($C_{11}$, $C_{12}$, and $C_{44}$) in the directions of modal expansion. For example, for the Lamé mode with modal expansion along the <110> directions (Lamé Eigenmode B), the value of TCE depends solely on the value of $C_{44}$, which in turn has its own temperature dependence and dependence on doping concentration. The following table shows the N-type and P-type doping concentrations required to reduce TCF2 to about zero for the considered eigenmodes.

TABLE 1

Comparison of TCF1 when TCF2 ≅ 0 for a Lamé mode aligned in different directions for various dopant types.

| Dopant Type and Direction of Modal Expansion | Eigenmode Identifier | Lamé mode at TCF2 ≅ 0 | |
| --- | --- | --- | --- |
| | | Dopant Concentration ($cm^{-3}$) | TCF1 (ppm/° C.) |
| N <100> | Lamé Eigenmode A | $1.43 \times 10^{20}$ | 25.76 |
| N <110> | Lamé Eigenmode B | $1.2 \times 10^{20}$ | −38.28 |
| P <100> | Lamé Eigenmode A | $2.23 \times 10^{20}$ | −12.65 |
| P <110> | Lamé Eigenmode B | $2.3 \times 10^{20}$ | 4.57 |

The values in Table 1 can be determined using FEM simulation software tools, or any other capable simulation software tools now known or later developed.

As shown in Table 1, the type of dopant, doping concentration, and eigenmode that results in a TCF1 with the smallest absolute value for the Lamé mode at TCF2≅0 is a P-doped substrate with a direction of modal expansion in the <110> direction at a doping concentration of $2.3 \times 10^{20}$ $cm^{-3}$. By using this type of dopant, doping concentration, and eigenmode, the resonator element will require less TCF1 compensation than the other combinations of type of dopant, doping concentration, and eigenmode. In the present example, there is only a single CTC mode in which the type of dopant, doping concentration, and eigenmode results in a relatively small TCF1 value, but in other examples there may be multiple CTC modes.

Figure 5:
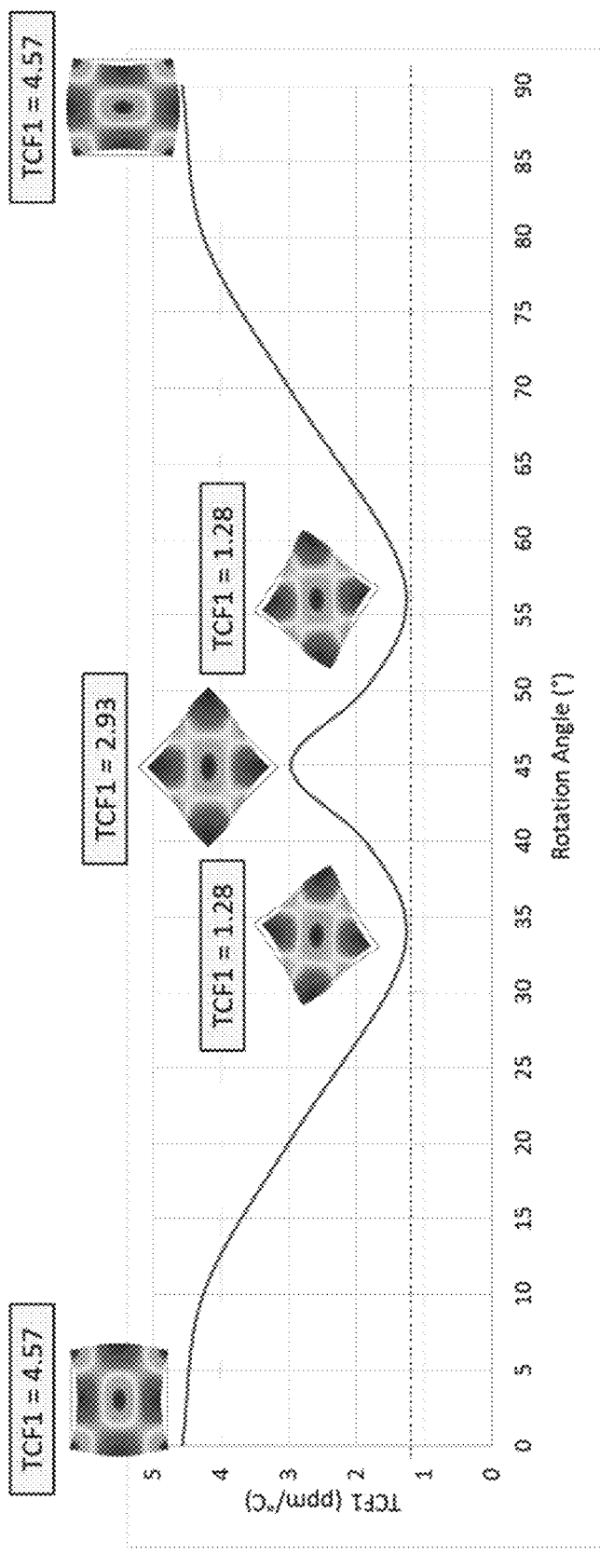
FIG. 5 depicts a plot of the first order temperature coefficient of frequency versus in-plane rotation angle with respect to the <110> crystal axis of silicon for a square resonator element operating in in-plane resonance modes.

Using the CTC mode identified above in Table 1, if one plots the corresponding TCF1 of the resonator element for the identified CTC mode at different in-plane rotations from 0° to 90° (in relation to the <110> direction), it can be seen that TCF1 has minima at ~1.28 ppm/° C. for rotations of 34° and 55°, as shown in FIG. 5. This trend would repeat every 90° due to the cubic lattice symmetry of silicon, so it may not be necessary to apply in-plane rotations at angles outside this range. In-plane rotations of 0° and 90° correspond to the Lamé mode with a <110> direction of modal expansion (Lamé Eigenmode B). Additionally, at a 45° in-plane rotation, the direction of modal expansion is aligned in the <100> direction which results in a Face-Shear (FS) mode. At intermediate angles the mode gradually transfers from a Lamé mode to a FS mode. Overall, while in this case TCF1 cannot be compensated by using rotation alone because the lowest possible TCF1 achievable through rotation is ~1.28 ppm/° C., for some applications, this may be sufficiently temperature compensated. Further examples disclosed herein will describe additional methods to further reduce TCF1.

c. Example with Out-Of-Plane Resonance Modes

The method depicted in flowchart 300 may also be implemented with resonator elements having out-of-plane resonance modes. In this example, both torsional and saddle modes are considered. Similar to the previous example, by plotting the values of TCF2 versus dopant concentrations for both N-type and P-type dopants for different eigenmodes, one can identify any combinations of dopant concentration and type of dopant that cause TCF2 to be about equal to zero for a resonator element with a particular eigenmode. Subsequently, one can determine TCF1 for each of the identified combinations of dopant concentration and type of dopant that cause TCF2 to be about equal to zero to determine whether there are any CTC modes in which TCF1 is sufficiently reduced. The following table lists the CTC modes identified for the resonator elements with the particular eigenmodes considered in this example.

TABLE 2

Comparison of TCF1 when TCF2 ≅ 0 for various out-of-plane eigenmodes.

| Dopant Type and Direction of Modal Expansion (In-plane) | Eigenmode Identifier | TCF2 ≅ 0 | |
|---|---|---|---|
| | | Dopant Concentration (cm$^{-3}$) | TCF1 (ppm/° C.) |
| P <110> | Torsional Eigenmode A | 2.32 × 10$^{20}$ | 3.2 |
| P <110> | Saddle Eigenmode A | 2.36 × 10$^{20}$ | 0.83 |

As before, once these CTC modes are identified, the next phase is to apply an in-plane rotation to the resonator element in order to slightly "distort" these CTC modes (introduce stray vibrations due to the geometric modifications thereby causing a deviation from the pure mode shape).

FIG. 6 depicts plots of TCF1 at various in-plane rotation angles of the resonator element with respect to the <110> direction for the CTC examples identified above in Table 2. Plot 602 shows the effect of in-plane rotation on Saddle Eigenmode A. In this case, an in-plane rotation of approximately 10° results in a TCF1 of approximately 0 ppm/° C. Plot 604 shows the effect of in-plane rotation on Torsional Eigenmode A. In this case, an in-plane rotation of approximately 7.5° results in a TCF1 of approximately 0 ppm/° C. In both cases, this trend would repeat every 90° due to the cubic lattice symmetry of silicon. Here, unlike the example resonator elements having in-plane resonance modes described above, these example resonator elements having out-of-plane resonance modes can have their TCF1 fully compensated for by using in-plane rotation alone.

IV. Passively Compensating Temperature-Induced Frequency Drifts in MEMS Resonators Via Geometric Modifications As discussed previously, high doping of a silicon substrate can compensate for the second order TCF2 instead of the first order TCF1, while modifications to the initial geometry of a resonator element can compensate for the first order TCF1. These geometric modifications can include adding areas to a resonator element and/or subtracting areas from a resonator element. Using these techniques can provide at least second-order temperature compensation of the MEMS resonator device, leading to enhanced inherent temperature stability (such as a temperature-induced frequency drift of less than 1 ppm between −40° C. and 85° C.) with proper design.

a. Method

FIG. 7 depicts a flowchart 700 that illustrates an example method for designing passively compensated MEMS resonator device with geometric modifications. The method depicted by flowchart 700 is largely similar to the method depicted by flowchart 100, except the method depicted by flowchart 700 does not involve applying any in-plane rotation to the resonator element and instead only involves applying geometric modifications that alter the geometry of the resonator element to reduce TCF1. As shown, at block 702, the method involves defining an initial resonator element geometry and an orientation with respect to the crystal axis of silicon. The method continues similarly to the method depicted in flowchart 100 until block 722, when a CTC mode has been identified.

The next phase is to apply geometric modifications to the resonator element in order to slightly "distort" the CTC modes (introduce stray vibrations due to the geometric modifications thereby causing a deviation from the pure mode shape). These geometric modifications can include adding areas to the resonator element, subtracting areas from the resonator element, or doing a combination of both. The geometric modifications that minimize the absolute value of TCF1 are selected with a parametric sweep approach. This approach entails establishing a selection of geometric shapes to be tested, systematically altering their dimensions and placement on the resonating element, and measuring the resultant TCF1. While the placement of geometric modifications may vary across embodiments, in these cases, the geometric additions are placed contiguously or at least partially overlapping with the regions of maximum displacement. The geometric subtractions may also be placed in this manner, or they may be placed along the axes of symmetry, depending on resonator design requirements.

Referring back to the flowchart 700 in FIG. 7, at block 722, geometric modifications such as those described above are applied until TCF1 is reduced to be about equal to zero at block 724. Then, at block 726, the resulting resonator design has at least a second order temperature compensation mode.

b. Example with Initially Square Resonator Elements

FIG. 8 depicts examples of a square silicon resonator element that may be considered in connection with the method shown in FIG. 7. Resonator elements such as this may resonate in many in-plane resonance modes, but in the examples shown in FIG. 8 only the Lamé and Face-Shear modes are considered. Pure shear versions of these resonance modes are only present for square resonator elements with edges aligned to <100> and <110> directions to the silicon crystal lattice. As noted above, for the Lamé resonance mode, the associated directions of modal expansion are the same as the alignment of the resonator edge. Therefore, for a Lamé resonance mode structure aligned in the <100> or <110> directions, the direction of modal expansion is in the <100> (Lamé Eigenmode A) or <110> (Lamé Eigenmode B) directions, respectively. However, for a FS resonance mode, the associated direction of modal expansion is 45° relative to the alignment of the resonator edge. Hence for a FS resonance mode structure aligned in the <100> or <110> directions, the direction of modal expansion is <110> (FS Eigenmode B) or <100> (FS Eigenmode A), respectively. In these embodiments, the direction of modal expansion is a convenient way to distinguish between eigenmodes. In alternative embodiments, a direction of modal expansion may not be defined, and alternative features may be used to distinguish between eigenmodes.

Similar to the example described above in connection with FIG. 4B, by plotting the values of TCF2 versus dopant concentrations for both N-type and P-type dopants for different eigenmodes, one can determine if there exists a combination of dopant concentration and type of dopant that causes TCF2 to be about equal to zero for a particular eigenmode. The following table shows the N-type and P-type doping concentrations that reduce TCF2 to about zero for the Lamé and FS modes, for modal expansions in the <100> and <110> directions of the silicon crystal lattice.

4.57 ppm/° C. based on having a <110> direction of modal expansion (Lamé Eigenmode B) and being doped with a P-type dopant at a dopant concentration of $2.3 \times 10^{20}$ cm$^{-3}$, and the FS mode resonator element has a TCF1 of 2.93 ppm/° C. based on having a <110> direction of modal expansion (FS Eigenmode B) and being doped with a P-type dopant at a dopant concentration of $2.34 \times 10^{20}$ cm$^{-3}$. Similar to the effects of in-plane rotation described above, the addition or subtraction of areas to or from the resonator element will similarly "distort" the eigenmode. Therefore, after areas are added to or subtracted from the FS mode resonator element (shown as FS mode resonator element 902 in FIG. 9 and FS mode resonator element 1002 in FIG. 10), these modified resonator elements are referred to herein as a "modified-FS mode resonator element," examples of which are shown as modified-FS mode resonator element 904 in FIG. 9 and modified-FS mode resonator element 1004

TABLE 3

Comparison of TCF1 when TCF2 ≅ 0 for a Lamé mode and
FS mode aligned in different directions for various dopant types.

| Dopant Type and Direction of Modal Expansion | At TCF2 ≅ 0 | | | | | |
|---|---|---|---|---|---|---|
| | Lamé mode | | | FS mode | | |
| | Eigenmode Identifier | Dopant Concentration (cm$^{-3}$) | TCF1 (ppm/° C.) | Eigenmode Identifier | Dopant Concentration (cm$^{-3}$) | TCF1 (ppm/° C.) |
| N <100> | Lamé Eigenmode A | $1.43 \times 10^{20}$ | 25.76 | FS Eigenmode A | $1.44 \times 10^{20}$ | 24.4 |
| N <110> | Lamé Eigenmode B | $1.2 \times 10^{20}$ | −38.28 | FS Eigenmode B | $1.27 \times 10^{20}$ | −35.01 |
| P <100> | Lamé Eigenmode A | $2.23 \times 10^{20}$ | −12.65 | FS Eigenmode A | $2.25 \times 10^{20}$ | −12.65 |
| P <110> | Lamé Eigenmode B | $2.3 \times 10^{20}$ | 4.57 | FS Eigenmode B | $2.34 \times 10^{20}$ | 2.93 |

The values in Table 3 can be determined using FEM simulation software tools or any other capable simulation software tools now known or later developed.

As shown in Table 3, the type of dopant, doping concentration, and eigenmode that results in a TCF1 with a sufficiently small absolute value for both the Lamé mode and the FS mode is a P-doped substrate with a direction of modal expansion in the <110> direction at a doping concentration of $2.3 \times 10^{20}$ cm$^{-3}$ and $2.34 \times 10^{20}$ cm$^{-3}$, respectively. Thus, in the present example, there are two CTC modes in which the type of dopant, doping concentration and eigenmode results in a relatively small TCF1 value. By using either of these combinations of type of dopant, doping concentration, and eigenmode, the resonator element will require less TCF1 compensation than the other combinations of type of dopant, doping concentrations, and eigenmode.

Once these CTC modes are identified, the next phase is to apply geometric modifications to the resonator element in order to slightly "distort" these CTC modes (introduce stray vibrations due to the geometric modifications thereby causing a deviation from the pure mode shape). As shown in Table 3, for the identified CTC modes, the FS mode has a smaller TCF1 (~2.93 ppm/° C.) than the Lamé mode (~4.57 ppm/° C.). Therefore, smaller geometric modifications may be needed for the FS mode to compensate for TCF1.

FIGS. 9 and 10 depict some examples of geometric modifications that may be applied to a Lamé mode resonator element or a FS mode resonator element to compensate for TCF1. In line with the discussion above in connection with Table 2, the Lamé mode resonator element has a TCF1 of in FIG. 10. Similarly, after areas are added to or subtracted from the Lamé mode resonator (shown as Lamé mode resonator element 906 in FIG. 9 and Lamé mode resonator element 1006 in FIG. 10), these modified resonators are referred to herein as a "modified-Lamé mode resonator elements," examples of which are shown as modified-Lamé mode resonator element 908 and modified-Lamé mode resonator element 1008 in FIG. 10.

FIG. 9 depicts examples of geometric modifications that involve adding areas to the geometries of the resonator elements. As shown, both the FS mode resonator element 902 and the Lamé mode resonator element 906 have an original area ($A_O$). To compensate for TCF1, additional areas may be added to the resonator elements, resulting in a new modified area ($A_M$) of the resonator elements. With respect to the modified-FS mode resonator element 904, the additional areas may be added near the corners of the resonator element 902, as this is where the largest displacements occur and, consequently, where geometric modifications will have the largest effect on TCF1. With respect to the modified-Lamé mode resonator element 908, the additional areas may be added near the sides of the resonator element, as this is where the largest displacements occur and, consequently, where geometric modifications will have the largest effect on TCF1. In either case, the size and/or positions of the added areas may be adjusted until TCF1 is reduced to about zero. As shown in FIG. 9, in order to reduce TCF1 to about zero for the modified-FS mode resonator element 904, the corner areas of the resonator element 902 may be extended until the ratio of $A_M/A_O$ is 1.29. Likewise, in order to reduce TCF1 to about zero for the modified-Lamé mode resonator element 908, the side areas of the resonator element 906 may be extended until the ratio of $A_M/A_O$ is 5.8.

FIG. 10 depicts examples of geometric modifications that involve subtracting areas from the geometries of the resonator elements. Again, as shown, both the FS mode resonator element 1002 and the Lamé mode resonator element 1006 have an original area ($A_O$). To compensate for TCF1, areas may be subtracted from the resonator elements to form one or more cavities in the resonator elements, resulting in a new modified area ($A_M$) of the resonator elements. With respect to the modified-FS mode resonator element 1004, the areas subtracted from the resonator element 1002 may be square-shaped areas aligned with the midpoints of the sides of the square resonator element 1002. With respect to the modified-Lamé mode resonator 1008, the areas subtracted from the resonator element 1006 may be square-shaped areas offset from the midpoints of the sides of the square resonator element 1006 and arranged along the diagonals of the square resonator element 1006. In either case, the size and/or positions of the added areas may be adjusted until TCF1 is reduced to about zero. As further shown in FIG. 10, in order to reduce TCF1 to about zero for the modified-FS mode resonator element 1004, the size of the subtracted areas may be chosen such that the ratio of $A_M/A_O$ is 0.977. Likewise, in order to reduce TCF1 to about zero for the modified-Lamé mode resonator element 1008, the size of the subtracted areas may be chosen such that the ratio of $A_M/A_O$ is 0.956.

It should be understood that the geometric modifications that may be applied to compensate for TCF1 are not limited to embodiments disclosed herein, but can also include embodiments where any other shape can be added or subtracted to give the desired effect of reducing TCF1 to about zero, based on resonator design requirements. Other embodiments can include adding or subtracting in different regions of the resonator besides the regions shown in FIGS. 9 and 10. For structural subtraction, the area subtracted might be distributed differently across the resonator in more or lesser subtracted areas. Other embodiments can include both adding and subtracting areas in different regions of the resonator. Also, it should be understood that the ratio of the areas of the modified structure to the original structure ($A_M/A_O$) required for TCF1 compensation are specific to the geometric modifications, such that different shapes added or subtracted will yield different ratios.

FIG. 11 depicts an example resonance mode of a Lamé mode resonator element 1102, as well as changes to the resonance mode caused by geometric modifications to the resonator element 1102. For instance, FIG. 11 depicts a resultant second order temperature compensated resonator element 1104 operating in a modified-Lamé mode after square areas have been subtracted from the diagonals of the Lamé mode resonator element 1102. FIG. 11 further depicts another resultant second order temperature compensated resonator element 1106 operating in a modified-Lamé mode after rectangular areas have been added to the edges of the Lamé mode resonator element 1102. FIG. 11 further depicts yet another resultant second order temperature compensated resonator element 1108 operating in a modified-Lamé mode after trapezoidal areas have been added to the edges of the Lamé mode resonator element 1102.

FIG. 12 depicts an example resonance mode of a FS mode resonator element 1202, as well as changes to the resonance mode caused by geometric modifications. For instance, FIG. 12 depicts a resultant second order temperature compensated resonator element 1204 operating in a modified-FS mode after square areas have been subtracted from the FS mode resonator element 1202. FIG. 12 further depicts another resultant second order temperature compensated resonator element 1206 operating in a modified-FS mode after substantially square-shaped areas have been added to the corners of the FS mode resonator element 1202. FIG. 12 further depicts yet another resultant second order temperature compensated resonator element 1208 operating in a modified-FS mode after substantially elliptical-shaped areas have been added to the corners of the FS mode resonator element 1202, such that the resultant second order temperature compensated resonator element 1208 is substantially x-shaped with rounded endpoints.

c. Example with Resonator Elements of Various Initial Shapes

To illustrate how the techniques described herein may be applicable to both resonator elements of various initial shapes and geometric modifications of various shapes, the following examples involve applying the method depicted in FIG. 7 to a circular resonator element and an octagonal resonator element, in addition to a square resonator element. Similar to the previous examples, by plotting the values of TCF2 versus dopant concentrations for both N-type and P-type dopants for different eigenmodes, one can identify any combinations of type of dopant and dopant concentration that cause TCF2 to be about equal to zero for a particular eigenmode. Subsequently, one can determine TCF1 for each of the identified combinations of dopant concentration and type of dopant that cause TCF2 to be about equal to zero to determine whether there are any CTC modes in which TCF1 is sufficiently reduced. The following table lists the CTC modes identified for the circular, octagonal, and square resonator elements with the particular eigenmodes considered in this example.

TABLE 4

| Comparison of TCF1 when TCF2 ≅ 0 for various initial geometries. | | | | |
|---|---|---|---|---|
| | | | TCF2 ≅ 0 | |
| Dopant Type and Direction of Modal Expansion | Initial Resonator Element Geometry | Eigenmode Identifier | Dopant Concentration (cm$^{-3}$) | TCF1 (ppm/° C.) |
| P <110> | Circle | Wineglass Eigenmode A | $2.31 \times 10^{20}$ | 4.14 |
| P <110> | Octagon | Wineglass Eigenmode B | $2.31 \times 10^{20}$ | 4.24 |
| P <110> | Square | FS Eigenmode B | $2.34 \times 10^{20}$ | 2.93 |
| P <110> | Square | Lamé Eigenmode B | $2.3 \times 10^{20}$ | 4.57 |

As before, once these CTC modes are identified, the next phase is to apply geometric modifications to the resonator element in order to slightly "distort" these CTC modes (introduce stray vibrations due to the geometric modifications thereby causing a deviation from the pure mode shape).

FIGS. 13 and 14 depict some examples of geometric modifications that may be applied to the circular and octagonal resonator elements in order to produce second order temperature compensated MEMS resonators. For instance, FIG. 13 depicts a circular resonator element 1302 operating in a wineglass mode before any geometric modification. FIG. 13 further depicts a resultant second order temperature compensated resonator element 1304 operating in a "modified-wineglass mode" after areas have been subtracted from the circular resonator element 1302. FIG. 13 further depicts another resultant second order temperature compensated resonator element 1306 operating in a modified-wineglass mode after substantially elliptical-shaped areas have been added to the circular resonator element 1302. FIG. 13 further depicts yet another resultant second order temperature compensated resonator element 1308 operating in a modified-wineglass mode after substantially square-shaped areas have been added to the circular resonator element 1302.

Referring next to FIG. 14, an octagonal resonator element 1402 operating in a wineglass mode before any geometric modification is depicted. FIG. 14 further depicts a resultant second order temperature compensated resonator element 1404 operating in a "modified-wineglass mode" after areas have been subtracted from the octagonal resonator element 1402. FIG. 14 further depicts another resultant second order temperature compensated resonator element 1406 operating in a modified-wineglass mode after substantially circular-shaped areas have been added to some of the sides of the octagonal resonator element 1402. FIG. 14 further depicts yet another resultant second order temperature compensated resonator element 1408 operating in a modified-wineglass mode after square-shaped areas have been added to some of the sides of the octagonal resonator element 1402.

d. Example with Resonator Elements Resonating in Out-Of-Plane Modes

To illustrate how the techniques described herein may be applicable to resonating elements with out-of-plane eigenmodes, the following examples involve applying the method depicted in FIG. 7 to resonator elements having saddle and torsional resonance modes. Similar to the previous examples, by plotting the values of TCF2 versus dopant concentrations for both N-type and P-type dopants for different eigenmodes, one can identify any combinations of dopant concentration and type of dopant that causes TCF2 to be about equal to zero for a particular eigenmode. Subsequently, one can determine TCF1 for each of the identified combinations of dopant concentration and type of dopant that cause TCF2 to be about equal to zero to determine whether there are any CTC modes in which TCF1 is sufficiently reduced. Table 2 above lists the CTC modes identified for square resonator elements having saddle and torsional resonance eigenmodes, which are considered in this example.

As before, once these CTC modes are identified, the next phase is to apply geometric modifications to the resonator element in order to slightly "distort" these CTC modes (introduce stray vibrations due to the geometric modifications thereby causing a deviation from the pure mode shape). In this example, in order to reduce the first order temperature coefficient of frequency, the areas added to the resonator element are in the out-of-plane direction.

FIG. 15 depicts some examples of geometric modifications that may be applied to a square resonator element having an out-of-plane resonance mode in order to produce second order temperature compensated MEMS resonators. For instance, FIG. 15 depicts a square resonator element 1502 operating in a torsional mode before any geometric modification is applied to the resonator element 1502. FIG. 15 further depicts a resultant second order temperature compensated resonator element 1504 operating in a "modified-torsional mode" after areas have been added to the resonator element 1502. As shown, the areas added to the resonator element 1502 to arrive at the resultant resonator element 1504 are added out-of-plane relative to the unmodified resonator element 1502. Namely, the added areas include square-shaped areas at the corners of the resonator element 1502 both above and below the plane of the unmodified resonator element 1502. FIG. 15 further depicts another resultant second order temperature compensated resonator element operating in a modified-torsional mode after areas have been subtracted from the resonator element 1502. As shown, the subtracted areas include square-shaped areas subtracted near a center of the resonator element 1502 along the diagonals of the resonator element 1502.

Additionally, FIG. 15 depicts a square resonator element 1508 operating in a saddle mode before any geometric modification is applied to the resonator element 1508. FIG. 15 further depicts a resultant second order temperature compensated resonator element 1510 operating in a "modified-saddle mode" after areas have been added to the resonator element 1508. As shown, the areas added to the resonator element 1508 to arrive at the resultant resonator element 1510 are added out-of-plane relative to the unmodified resonator element 1508. Namely, the added areas include rectangular-shaped areas at the edges of the resonator element 1508 above the plane of the unmodified resonator element 1508. FIG. 15 further depicts another resultant second order temperature compensated resonator element 1512 operating in a modified-saddle mode after areas have been subtracted from the resonator element 1508. As shown, the subtracted areas include rectangular-shaped areas subtracted near a center of the resonator element 1508 at positions that align with the midpoints of the edges of the resonator element 1508.

V. Passively Compensating Temperature-Induced Frequency Drifts in Square Shaped MEMS Resonators Via Both In-Plane Rotation and Geometric Modification As described above in connection with FIG. 1, based on resonator design requirements, it may be desirable to passively compensate temperature-induced frequency drifts in a MEMS resonator using both in-plane rotation and geometric modifications. To illustrate with an example, the method depicted in FIG. 1 that involves using both in-plane rotation of the resonator element and geometric modifications to the resonator element has been applied to the 34° rotated Lamé mode resonator element seen in FIG. 5. As shown in Table 1, this resonator element had a TCF1 equal to 4.57 ppm/° C. prior to in-plane rotation. After the 34° in-plane rotation, TCF1 is reduced to 1.28 ppm/° C.

Once this CTC mode is identified and the initial orientation of the resonator element is altered with in-plane rotation, the next phase is to apply geometric modifications to the resonator element in order to slightly "distort" these CTC modes (introduce stray vibrations due to the geometric modifications thereby causing a deviation from the pure mode shape).

FIG. 16 depicts an example of using a parametric sweep approach to determine a geometric modification that results in a second order temperature compensated MEMS resonator. Without geometric modification, the 34° rotated Lamé mode resonator element has an $A_M/A_O=1$ while TCF1 is 1.28 ppm/° C. As shown in FIG. 16, plot 1602 depicts a parametric sweep in which the sizes of four square areas to be subtracted from the 34° rotated Lamé mode resonator element are varied, decreasing $A_M/A_O$ until TCF1 is about equal to zero at $A_M/A_O=0.9951$. By applying an appropriate in-plane rotation prior to the geometric modification, the extent of geometric modification required to reduce TCF1 to about zero may be significantly reduced. For instance, in the present example, after applying the 34° in-plane rotation, the amount of geometric modification via subtraction required to compensate for TCF1 (as characterized by $A_M/A_O$) is much smaller than in the 0°/90° Lamé mode resonator case, where the amount of geometric modification required to compensate for TCF1 is characterized by $A_M/A_O$=0.956, as described above and depicted in FIG. 10.

As further shown in FIG. 16, plot 1604 depicts a parametric sweep in which the sizes of four rectangular areas to be added to the 34° rotated Lamé mode resonator element are varied, increasing $A_M/A_O$ until TCF1 is about equal to zero at $A_M/A_O$=1.011. Again, by applying an appropriate in-plane rotation prior to the geometric modification, the extent of geometric modification via addition required to reduce TCF1 to about zero may be significantly reduced. For instance, in the present example, after applying the 34° in-plane rotation, the amount of geometric modification required to compensate for TCF1 (as characterized by $A_M/A_O$) is much smaller than in the 0°/90° Lamé mode resonator case, where the amount of geometric modification required to compensate for TCF1 is characterized by $A_M/A_O$=5.8, as described above and depicted in FIG. 9.

FIG. 17 depicts the example geometric modifications identified using the parametric sweeps depicted in FIG. 16 that may be applied to the 34° rotated Lamé mode resonator in order to produce a second order temperature compensated MEMS resonator. For instance, FIG. 17 depicts the 34° rotated Lamé mode resonator element 1702 before geometric modification. FIG. 17 further depicts a resultant second order temperature compensated 34° rotated Lamé mode resonator element 1704 after square-shaped areas have been subtracted near a center of the resonator element 1702 to produce a modified resonator element area characterized by $A_M/A_O$=0.9951, thereby reducing TCF1 to about zero. FIG. 17 further depicts another resultant second order temperature compensated 34° rotated Lamé mode resonator element 1706 after square-shaped areas have been added to the corners of the resonator element 1702 to produce a modified resonator element area characterized by $A_M/A_O$=1.011, thereby reducing TCF1 to about zero.

VI. Conclusion

It should be understood that the techniques described herein to reduce TCF2 or TCF1 to zero or about zero do not necessarily involve reducing TCF2 and TCF1 to exactly zero. Rather, it is sufficient to reduce TCF2 and/or TCF1 to be as close to zero as is practically possible. In some embodiments, this may involve reducing TCF2 to be less than 1 ppb/° C.$^2$ and/or reducing TCF1 to be less than 1 ppm/° C. In other embodiments, this may involve reducing TCF2 to be less than 0.1 ppb/° C.$^2$ and/or reducing TCF1 to be less than 0.1 ppm/° C. Still in other embodiments, this may involve reducing TCF2 to be less than 0.01 ppb/° C.$^2$ and/or reducing TCF1 to be less than 0.01 ppm/° C.

Additionally, it should be understood that, while the techniques disclosed herein are described in connection with square, circular, and octagonal resonators, the techniques can be similarly applied in connection with resonators of other shapes as well, such as rectangular resonators, elliptical resonators, or any other shape of resonator. In addition, while the techniques disclosed herein that involve subtracting areas from resonator elements are described in connection with subtracting square-shaped areas, the techniques can be similarly applied to other shapes as well, such as rectangular, circular, or elliptical subtracted areas.

The techniques described herein can be used to design a microelectromechanical resonator device and fabricate a microelectromechanical device according to the design. For instance, once the MEMS resonator device has been designed using the techniques described herein, the device may be fabricated using any semiconductor fabrication techniques now known or later developed; such a MEMS resonator device can include a support structure such as a silicon substrate, a resonator element capable of resonating at least partly with an in-plane resonance mode, at least one anchor coupling the resonator element to the support structure, at least one driving electrode and at least one sensing electrode. In some examples, the device can be configured to operate as an oscillator.

Further, when carrying out the techniques described herein, the actual resulting values of the compensated TCF1 as a result of modifying the geometry and/or orientation of the resonator element may differ slightly from the theoretical values gleaned from the simulation tools. For instance, extrapolation errors in the simulation model may cause the theoretical values of the compensated TCF1 to be offset from the actual values of the compensated TCF1 by some amount. Other inaccuracies in the simulation model or imperfections in a real-world MEMS resonator device may also contribute to this difference. As such, when using the techniques described herein to design a MEMS resonator device, the extent of the actual geometric modification and/or rotation of the resonator element applied during the manufacture of the device may be varied from the theoretical values by some amount. The extent of this amount may be determined in various ways, such as through experimentation, e.g., by varying the theoretical values by various amounts until the desired compensated TCF1 is achieved, or any other applicable technique.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

The invention claimed is:

1. A method for designing a MEMS resonator device with passive temperature-induced frequency drift compensation, the method comprising:
determining, for a resonator element of the MEMS resonator device, an initial geometry and an initial orientation with respect to a crystal axis of silicon that cause the resonator element to have at least one associated eigenmode of vibration;
selecting, from among the at least one associated eigenmode of vibration, a particular eigenmode;
determining, for the resonator element with the particular eigenmode, a particular set of parameters including at least a combination of (i) a type of dopant and (ii) a dopant concentration that causes a closely temperature-compensated mode in which (i) an absolute value of a first order temperature coefficient of frequency of the resonator element is reduced to a first value that is below a threshold value and (ii) an absolute value of a second order temperature coefficient of frequency of the resonator element is reduced to about zero;
modifying, for the resonator element with the particular eigenmode and the particular set of parameters, one or both of the initial geometry or the initial orientation of the resonator element such that the absolute value of the first order temperature coefficient of frequency of the resonator element is further reduced to a second value smaller than the first value; and positioning an anchor at a center of the resonator element such that the anchor extends in an out-of-plane direction relative to the resonator element to attach the resonator element to a support structure.

2. The method of claim 1, wherein modifying one or both of the initial geometry or the initial orientation of the resonator element comprises applying an in-plane rotation to the resonator element.

3. The method of claim 1, wherein modifying one or both of the initial geometry or the initial orientation of the resonator element comprises adding one or more additional areas to the resonator element.

4. The method of claim 1, wherein modifying one or both of the initial geometry or the initial orientation of the resonator element comprises subtracting one or more areas from the resonator element.

5. The method of claim 1, wherein modifying one or both of the initial geometry or the initial orientation of the resonator element comprises adding one or more additional areas to the resonator element as well as subtracting one or more areas from the resonator element.

6. The method of claim 2, wherein modifying one or both of the initial geometry or the initial orientation of the resonator element further comprises adding one or more additional areas to the resonator element after applying the in-plane rotation to the resonator element.

7. The method of claim 6, wherein applying the in-plane rotation to the resonator element comprises applying the in-plane rotation to the resonator element at an angle that reduces the absolute value of the first order temperature coefficient of frequency of the resonator element to the second value, and wherein adding the one or more additional areas to the resonator element further reduces the absolute value of the first order temperature coefficient of frequency to a third value less than the second value.

8. The method of claim 2, wherein modifying one or both of the initial geometry or the initial orientation of the resonator element further comprises subtracting one or more areas from the resonator element after applying the in-plane rotation to the resonator element.

9. The method of claim 8, wherein applying the in-plane rotation to the resonator element comprises applying the in-plane rotation to the resonator element at an angle that reduces the absolute value of the first order temperature coefficient of frequency of the resonator element to the second value, and wherein subtracting the one or more areas from the resonator element further reduces the absolute value of the first order temperature coefficient of frequency to a third value less than the second value.

10. The method of claim 2, wherein modifying one or both of the initial geometry or the initial orientation of the resonator element further comprises adding one or more additional areas to the resonator element as well as subtracting one or more areas from the resonator element after applying the in-plane rotation to the resonator element.

11. The method of claim 10, wherein applying the in-plane rotation to the resonator element comprises applying the in-plane rotation to the resonator element at an angle that reduces the absolute value of the first order temperature coefficient of frequency of the resonator element to the second value, and wherein adding one or more additional areas to the resonator element as well as subtracting one or more areas from the resonator element further reduces the absolute value of the first order temperature coefficient of frequency to a third value less than the second value.

12. The method of claim 1, wherein the resonator element comprises a square resonator element or a substantially square with rounded corners resonator element, and wherein modifying one or both of the initial geometry or the initial orientation of the resonator element comprises (i) adding one or more trapezoidal-shaped or elliptical-shaped areas to one or more sides or corners of the resonator element or (ii) subtracting one or more square-shaped or rectangular-shaped areas from the resonator element.

13. The method of claim 1, further comprising:

operatively connecting at least one driving electrode to the resonator element for electrostatic actuation of the resonator element; and operatively connecting at least one sense electrode to the resonator element for electrostatic sensing of the resonator element.

14. The method of claim 1, wherein the resonator element comprises a square resonator element or a substantially square resonator element, and wherein modifying one or both of the initial geometry or the initial orientation of the resonator element comprises adding one or more square-shaped or rectangular-shaped areas to one or more sides or corners of the resonator element.

15. The method of claim 1, wherein the resonator element comprises a rectangular resonator element, and wherein modifying one or both of the initial geometry or the initial orientation of the resonator element comprises (i) adding one or more trapezoidal-shaped or elliptical-shaped areas to one or more sides or corners of the resonator element or (ii) subtracting one or more square-shaped or rectangular-shaped areas from the resonator element.

16. The method of claim 1, wherein the absolute value of the first order temperature coefficient of frequency of the resonator element is further reduced to the second value smaller than the first value further based on the particular set of parameters determined for the resonator element.

17. The method of claim 1, wherein the MEMS resonator device, when fabricated, is configured to operate as an oscillator.

18. The method of claim 1, wherein the particular eigenmode comprises a modified-FS mode.

19. The method of claim 1, wherein the particular eigenmode comprises a modified-Lamé resonance.

20. The method of claim 1, wherein the type of dopant comprises N-type dopants.

21. The method of claim 1, wherein the type of dopant comprises P-type dopants.

22. The method of claim 1, wherein the type of dopant comprises (i) homogenous N-type dopants or (ii) homogenous P-type dopants.

23. The method of claim 1, further comprising:

based on the particular eigenmode, determining one or more placements for one or more additional areas to be added to the resonator element, wherein each determined placement is either (i) near a respective corner of the resonator element or (ii) near a respective side of the resonator element; and based on the particular eigenmode, determining one or more locations for one or more areas to be subtracted from the resonator element, wherein each determined location is either (i) aligned with a midpoint of a respective side of the resonator element or (ii) offset from a midpoint of a respective side of the resonator element;

wherein modifying one or both of the initial geometry or the initial orientation of the resonator element comprises:

adding one or more additional areas to the resonator element at the one or more placements determined based on the particular eigenmode; and subtracting one or more areas from the resonator element at the one or more locations determined based on the particular eigenmode.

* * * * *